United States Patent
Luan

(10) Patent No.: US 11,444,084 B2
(45) Date of Patent: *Sep. 13, 2022

(54) MULTI-LAYER HORIZONTAL THYRISTOR RANDOM ACCESS MEMORY AND PERIPHERAL CIRCUITRY

(71) Applicant: TC Lab, Inc., Gilroy, CA (US)

(72) Inventor: Harry Luan, Saratoga, CA (US)

(73) Assignee: TC Lab, Inc., Gilroy, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/218,020

(22) Filed: Mar. 30, 2021

(65) Prior Publication Data

US 2021/0217753 A1 Jul. 15, 2021

Related U.S. Application Data

(60) Division of application No. 16/801,105, filed on Feb. 25, 2020, now Pat. No. 10,964,699, which is a continuation of application No. 16/107,984, filed on Aug. 21, 2018, now Pat. No. 10,573,650, which is a continuation-in-part of application No. 16/007,992, filed on Jun. 13, 2018, now Pat. No. 10,700,069.

(51) Int. Cl.

| | | |
|---|---|---|
| H01L 29/66 | (2006.01) | |
| H01L 27/10 | (2006.01) | |
| H01L 23/535 | (2006.01) | |
| H01L 27/108 | (2006.01) | |
| H01L 29/74 | (2006.01) | |
| H01L 21/02 | (2006.01) | |

(52) U.S. Cl.
CPC .. *H01L 27/10802* (2013.01); *H01L 21/02647* (2013.01); *H01L 23/535* (2013.01); *H01L 27/10844* (2013.01); *H01L 29/66393* (2013.01); *H01L 29/7436* (2013.01)

(58) Field of Classification Search
CPC .......... H01L 29/66393; H01L 29/7436; H01L 27/10802; H01L 27/10804; H01L 23/535; H01L 21/02647
USPC ........................................................ 257/146
See application file for complete search history.

(56) References Cited

U.S. PATENT DOCUMENTS

| | | |
|---|---|---|
| 9,449,987 B1 | 9/2016 | Miyata et al. |
| 9,812,454 B2 | 11/2017 | Luan et al. |
| 10,573,650 B2 | 2/2020 | Luan et al. |
| 10,964,699 B2 * | 3/2021 | Luan .................... H01L 23/535 |

* cited by examiner

*Primary Examiner* — Monica D Harrison
(74) *Attorney, Agent, or Firm* — Aka Chan LLP

(57) ABSTRACT

A semiconductor structure for a DRAM is described having multiple layers of arrays of thyristor memory cells and associated peripheral circuitry. Memory cells in a vertical string extending through the layers have an electrical connection to one terminal of the memory cells in that string. Word lines couple the strings together. Each layer of the array also includes bit line connections to memory cells on that layer. Methods of fabricating the array are described.

6 Claims, 28 Drawing Sheets

Figure 2

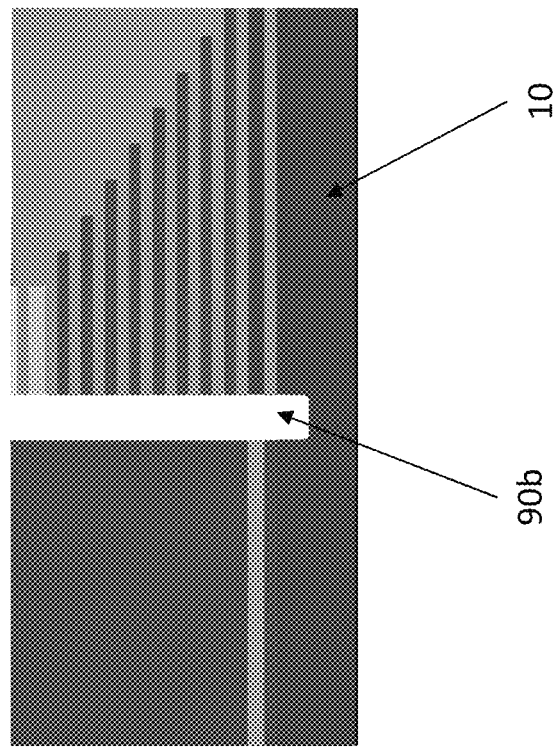
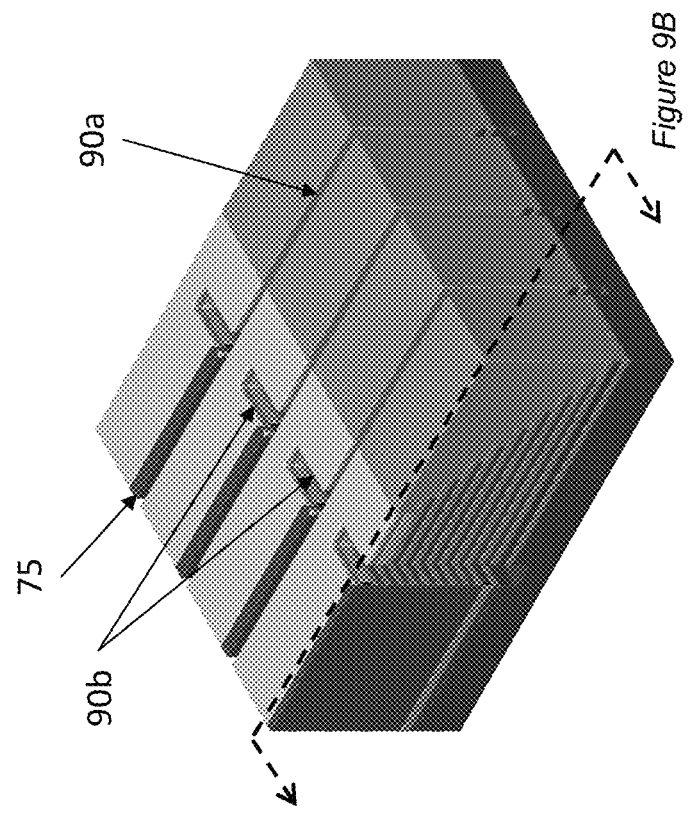
Figure 9A
Figure 9B

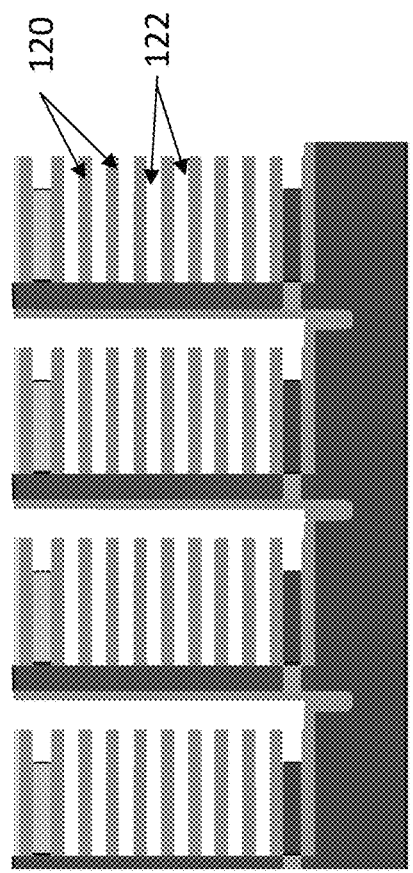
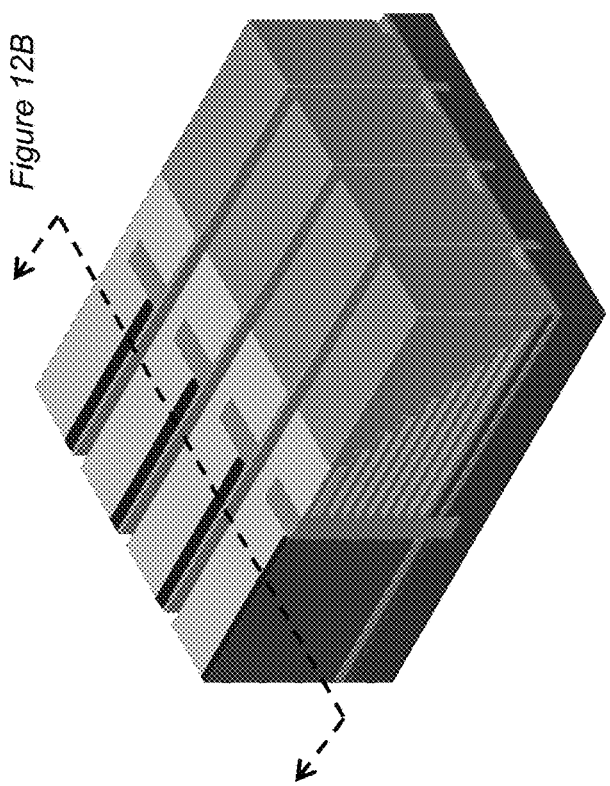
Figure 12A
Figure 12B

MULTI-LAYER HORIZONTAL THYRISTOR RANDOM ACCESS MEMORY AND PERIPHERAL CIRCUITRY

CROSS-REFERENCE TO RELATED APPLICATIONS

This application is a divisional of U.S. patent application Ser. No. 16/801,105, filed Feb. 25, 2020, entitled "Multi-Layer Horizontal Thyristor Random Access Memory and Peripheral Circuitry," issued as U.S. Pat. No. 10,964,699 on Mar. 30, 2021, which is a continuation of U.S. patent application Ser. No. 16/107,984, filed Aug. 21, 2018, entitled "Multi-Layer Horizontal Thyristor Random Access Memory and Peripheral Circuitry," issued as U.S. Pat. No. 10,573,650 on Feb. 25, 2020, which is a continuation-in-part of U.S. patent application Ser. No. 16/007,992, filed Jun. 13, 2018, entitled "Multi-Layer Thyristor Random Access Memory with Silicon-Germanium Bases," issued as U.S. Pat. No. 10,700,069 on Jun. 30, 2020. These applications are incorporated by reference along with all other references cited in this application.

BACKGROUND OF THE INVENTION

This invention relates to semiconductor devices for information storage. In particular, the invention relates to a multi-layer memory device for a random access memory and to methods of fabrication of such a memory.

Various dynamic random access memory (DRAM) semiconductor cell structures have been proposed using thyristors. The assignee herein describes several thyristor semiconductor structures for DRAMs, and the processes for manufacturing them in two as well as three-dimension arrays in various commonly assigned co-pending patent applications. See, e.g., the provisional patent applications cited above. This application describes improvements over the technology described in those applications.

The 1-transistor 1-capacitor memory cell has been by far the predominant memory cell used in DRAM devices for the last 30 years. Bit density has quadrupled approximately every 3 years by lithographical scaling and ever increasing process complexity. Maintaining the capacitance value and low transistor leakage, however, are significant issues for further reductions in cell area.

Recently alternative DRAM cells have been proposed to overcome the scaling challenges of conventional DRAM technology. These include floating body DRAM (FBDRAM), a single MOSFET built on either a silicon-on-insulator (Okhonin, Int. SOI Conf., 2001) or in triple-well with a buried n-implant (Ranica, VLSI Technology, 2004). These technologies have yet to solve data retention issues, particularly in small geometry cells.

Various cell designs have been proposed based on the negative differential resistance behavior of a thyristor. An active or passive gate is often used in these designs to optimize trade-offs among switching speed, retention leakage, and operation voltage. The thin capacitively coupled thyristor disclosed in U.S. Pat. No. 6,462,359 is a lateral pnpn thyristor constructed on a silicon on insulator substrate with a coupling gate for increased switching speed.

Liang in U.S. Pat. No. 9,013,918 disclosed a pnpn thyristor cell that is constructed on a silicon substrate and operated in forward and reverse breakdown region for writing data into the cell. The use of epitaxial or CVD semiconductor layers at the backend of the standard CMOS process, add-on thermal cycles and etch steps, however, degrade performance and yield of devices already formed on, or in, the substrate. In addition, pnpn devices operated in the breakdown regime pose challenges in process control and power consumption.

Recently, Kim et al. reported electrical characteristics for a thyristor based memory in "Design and Electrical Characterization of 2-T Thyristor RAM with Low Power Consumption," IEEE Electron Device Letters, volume 39, issue 3, Jan. 23, 2018.

BRIEF SUMMARY OF THE INVENTION

A multi-layer random access memory array semiconductor structure is disclosed herein. The structure is formed on a semiconductor substrate and includes multiple layers, with each layer having an x row by y column array of memory cells on that layer. A memory cell in a layer will have a location $M_{xy}$ meaning it is located in the x row and y column on that layer. We refer to a stack of the memory cells extending in the z direction perpendicular to the layers as being a "string" of memory cells, i.e. a string is a stack of memory cells arranged one above another vertically. Thus a string of memory cells will connect one memory cell $M_{xy}$ at a particular location in each layer to the memory cells directly above and directly below it.

In one embodiment in which the memory cells are thyristors, the anodes of thyristors in a string of memory cells are connected together by a vertical electrical connection extending through all of the layers. Word lines for the memory array extend in the x direction and are connected to rows of these vertical electrical connections. Bit lines are provided in each layer. Each bit line extends in the y direction and is connected to a column of thyristor cathodes in that layer. Selection of one word line selects one row of the vertical electrical connections. Selection of one bit line selects a horizontal column of memory cells in one layer. Together the word line and bit line selections address one thyristor in one layer. (Of course rows and columns in a single layer of the array could also be referred to as columns and rows in that layer.)

In another embodiment, shared bit lines are used in the memory array meaning one bit line in a layer is connected to thyristors in two or more strings. In this embodiment selection of one bit line would result in accessing more than one memory cell coupled to the same word line. To avoid this and enable random access, we provide select transistors at each end of each string of memory cells, i.e. at the top and bottom of each vertical anode line. This allows selection among memory cells if shared by a single bit line.

As mentioned the bit lines in each embodiment extend horizontally in the y direction on each layer. In the semiconductor structure, each bit line extending further away from the array than the bit line on the layer above it, creating a "staircase" of connections. Additional vertical connections (in the z direction are made to the bit lines where each bit line extends beyond the bit line in the layer above it. In a preferred embodiment select transistors are vertical gate nmos and pmos transistors in layers above the top layer of the memory array and below the bottom layer of the array.

Peripheral circuitry for addressing the memory array, writing data to it, and reading data from it, may be fabricated on the same die as the memory array. A process for integrating formation of the peripheral circuitry with the fabrication of the memory array is described.

A process for manufacturing the semiconductor structure described above includes steps of depositing alternating layers of insulating material and first material on a semiconductor substrate, and etching holes or trenches through the alternating layers. Crystalline silicon is then selectively grown in the holes or trenches before the first material is etched away from the side exposed by a cut etch, thus forming cavities between the layers of insulating material.

After removal of the first material, a confined epitaxial lateral overgrowth (CELO) process is used to form crystalline silicon in the cavities. The CELO silicon is in-situ doped during the growth to form the needed memory cells, e.g. pnpn regions for thyristors. Later, electrical connections are provided to the semiconductor devices by making ohmic contacts to the top and side.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 4-25 illustrate processes for fabricating the memory array shown in FIG. 1, with FIG. 4 illustrating stacked layers of silicon dioxide and silicon nitride.

FIG. 5 illustrates formation of slots 50.

FIG. 7 illustrates selective epitaxial growth of silicon within the slots 50.

FIG. 8 illustrates staircase patterning and etching steps.

FIGS. 9A and 9B illustrate formation of slots 90a and 90b.

FIGS. 12A and 12B illustrate epitaxy block oxidation and removal of silicon nitride layers.

FIG. 14 illustrates self-aligned formation of metal contacts to the thyristors.

FIG. 15 illustrates silicon dioxide fill and planarization.

FIG. 16 illustrates anisotropic etching of the thyristor stack and oxide fill to isolate thyristor regions.

FIG. 17 illustrates etching of SEG silicon holes down to pmos drain regions.

FIG. 18 illustrates metal deposition and planarization.

FIG. 20 illustrates formation of an nmos select transistor channel and source/drain regions.

FIG. 22 illustrates conformal deposition and planarization of the assist gates

FIG. 23 illustrates etching openings for electrical contacts to anodes and assist gates.

FIG. 24 illustrates etching openings for electrical contacts to staircases.

FIG. 25 illustrates formation of first level metal lines.

FIGS. 27-34 illustrate techniques for integrating peripheral circuitry for the memory on the same semiconductor substrate as the memory structure illustrated in FIGS. 1-26, wherein:

FIG. 27 illustrates the structure of FIG. 26 combined with peripheral circuitry formed in lower layers elsewhere on the substrate.

FIG. 28 illustrates the structure of FIG. 26 combined with peripheral circuitry formed in upper layers elsewhere on the substrate.

FIG. 29 illustrates integration of the thyristor process with a peripheral process.

FIG. 30 illustrates the process after etching the dielectric fill material.

FIG. 31 illustrates the process after formation of epitaxial semiconductor material in the peripheral circuit region.

FIG. 32 illustrates the process after formation of support oxide.

FIG. 33 illustrates the structure after formation of trench isolation in the peripheral region.

DETAILED DESCRIPTION OF THE INVENTION

The assignee of this application has previously disclosed thyristor cells used as memory devices in a variety of applications. It is advantageous, however, to be able to stack the thyristors, as well as other type memory cells, to provide multiple layers of memory cells in a memory array. This increases bit density per unit area and further reduces patterning cost. The present application discloses a new multiple layer dynamic random access memory structure, preferably employing thyristors, as well as methods of manufacturing such a memory.

Features of the invention include: an exemplary stacked thyristor cell array with thyristors selectively formed using confined epitaxial lateral overgrowth (CELO) of single crystalline silicon, or other semiconductor; stacked access lines having staggered connections to provide cathode connections; and vertical access lines to contact thyristor anodes. Each lateral thyristor consists of pnpn or npnp in-situ doped during epitaxial growth. Select transistors for addressing cells in the memory array, as well as assist gates to improve thyristor performance are also provided. Metal plugs replace silicon pillars reducing string resistance and minority carrier effects.

Figure 1:
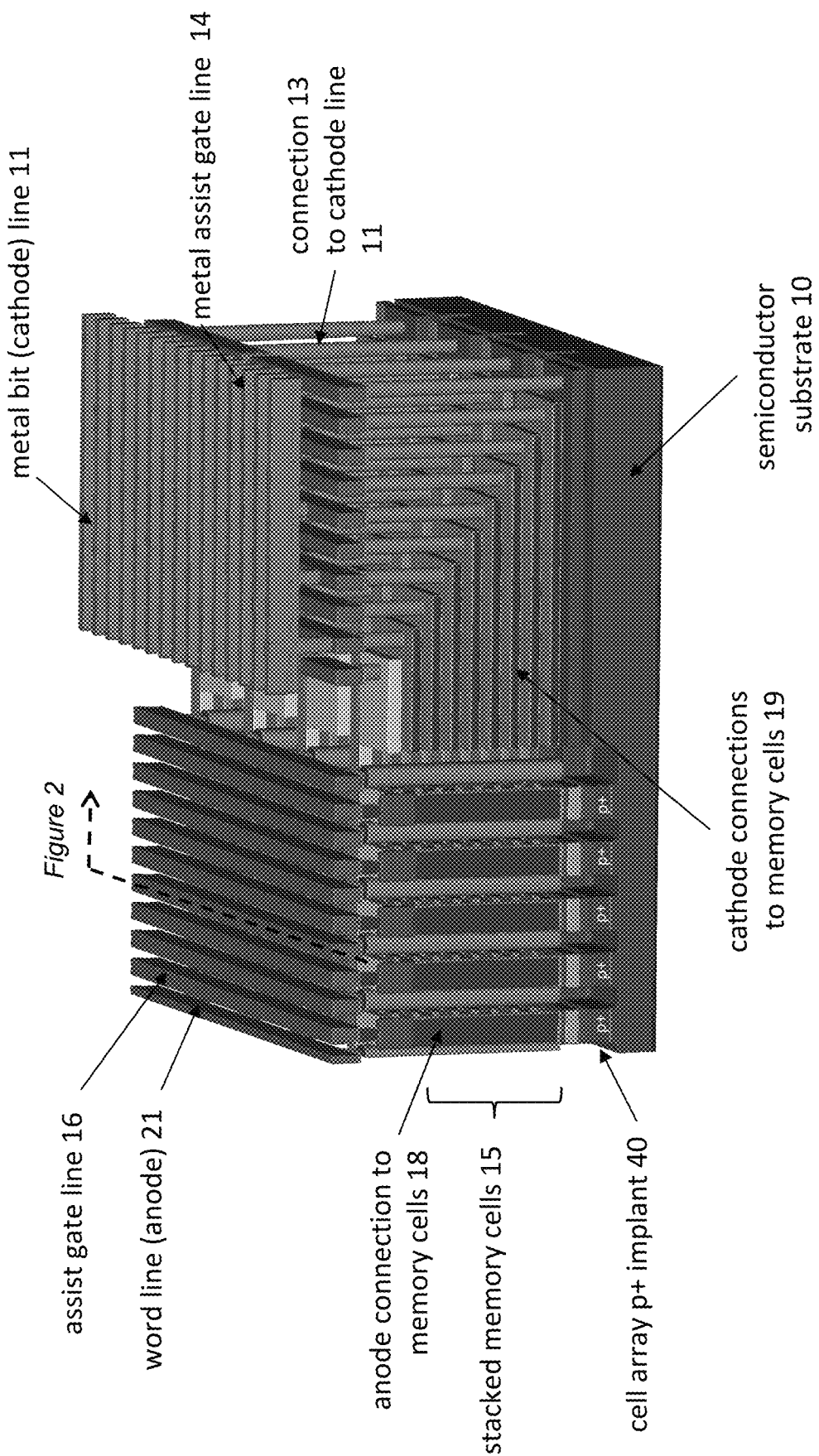
FIG. 1 is a perspective view of an 8-layer stacked memory array with thyristor memory cells.
Figure 2:
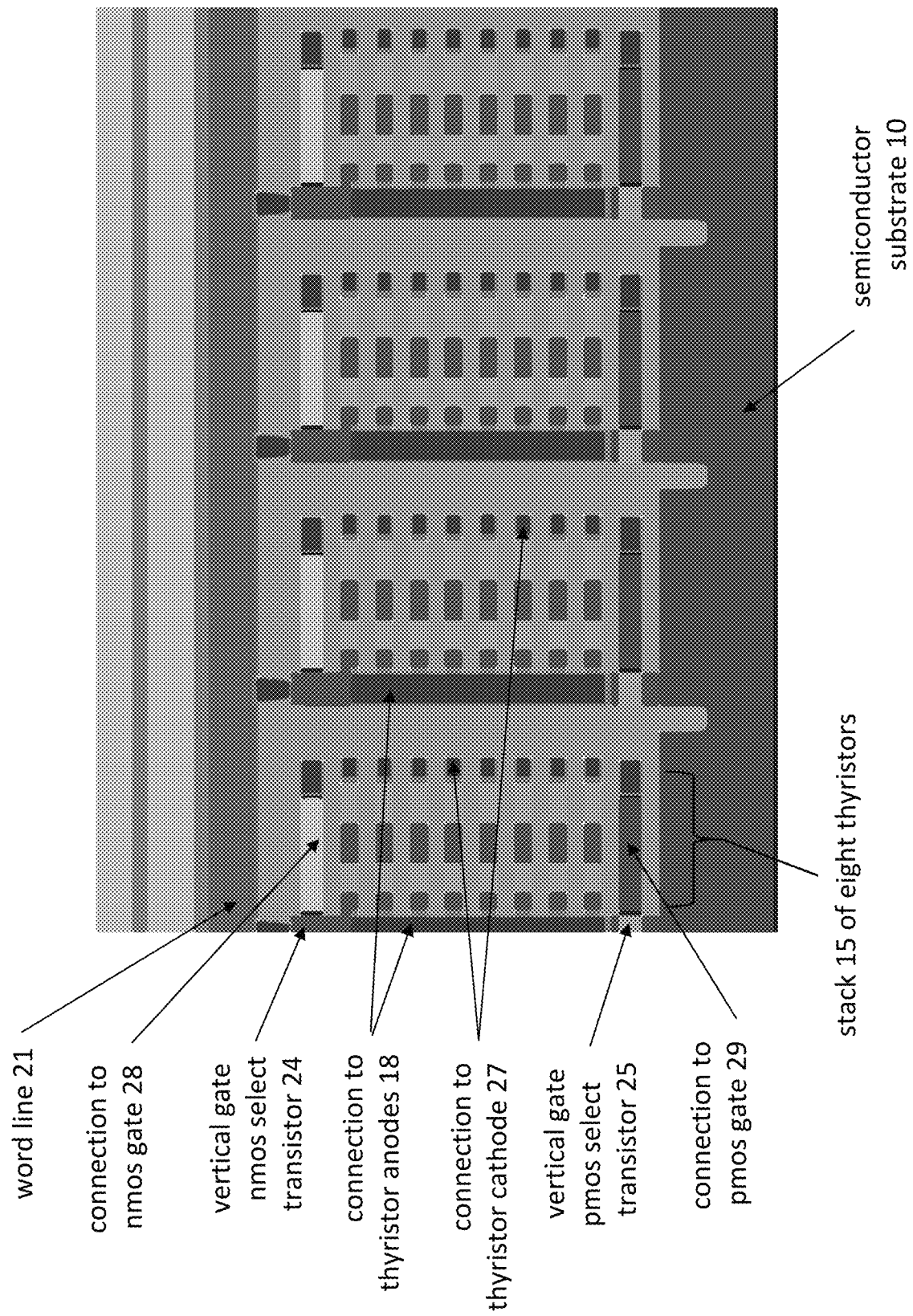
FIG. 2 is a cross-sectional view along an anode line of the array shown in FIG. 1.

FIGS. 1-3 illustrate the memory array semiconductor structure and circuit. FIGS. 4-25 illustrate a preferred process for fabricating the array.

Figure 3A:
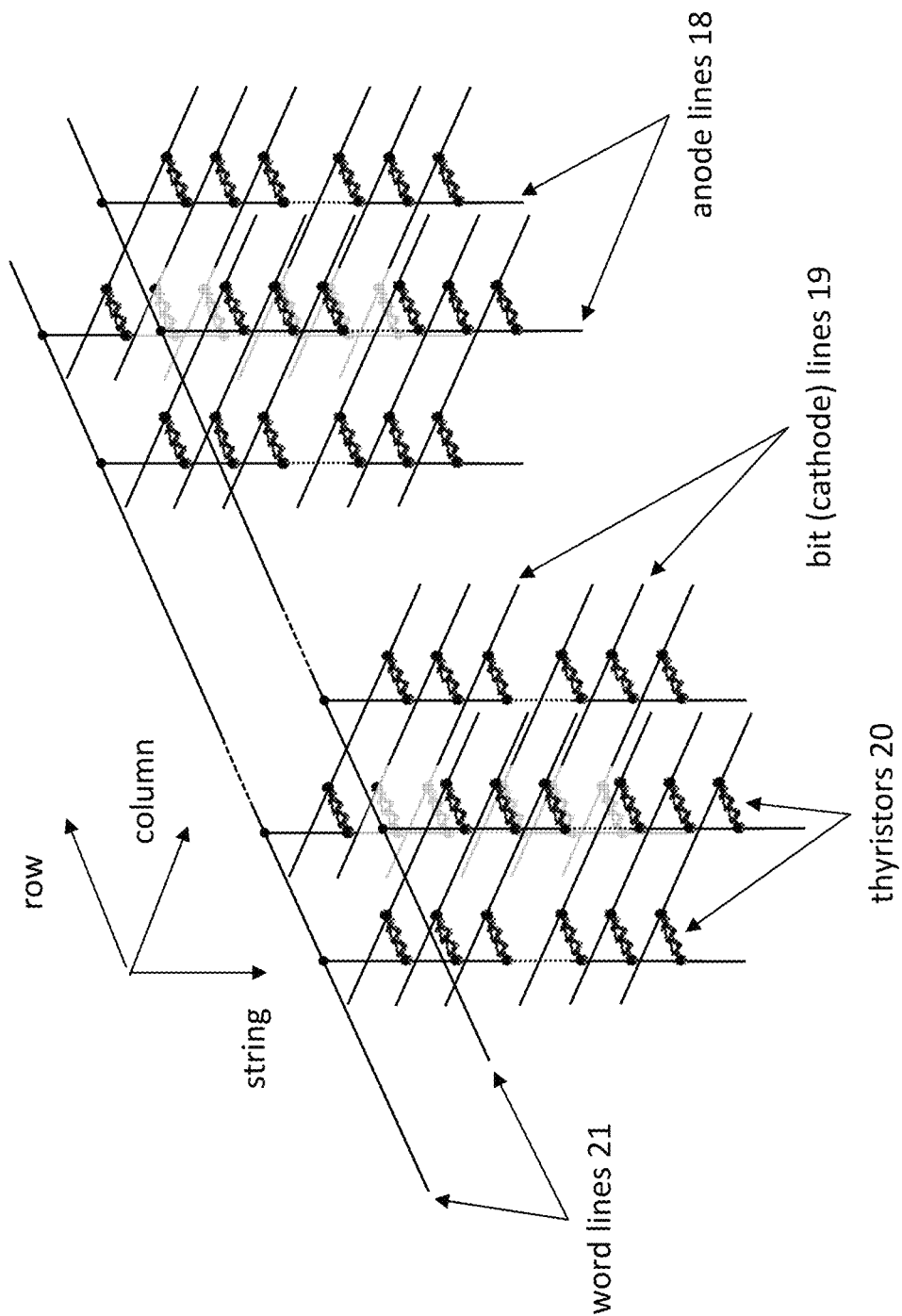
FIG. 3A is a circuit schematic of a portion of a memory array illustrating word lines, bit lines and anode lines of the array.
Figure 3B:
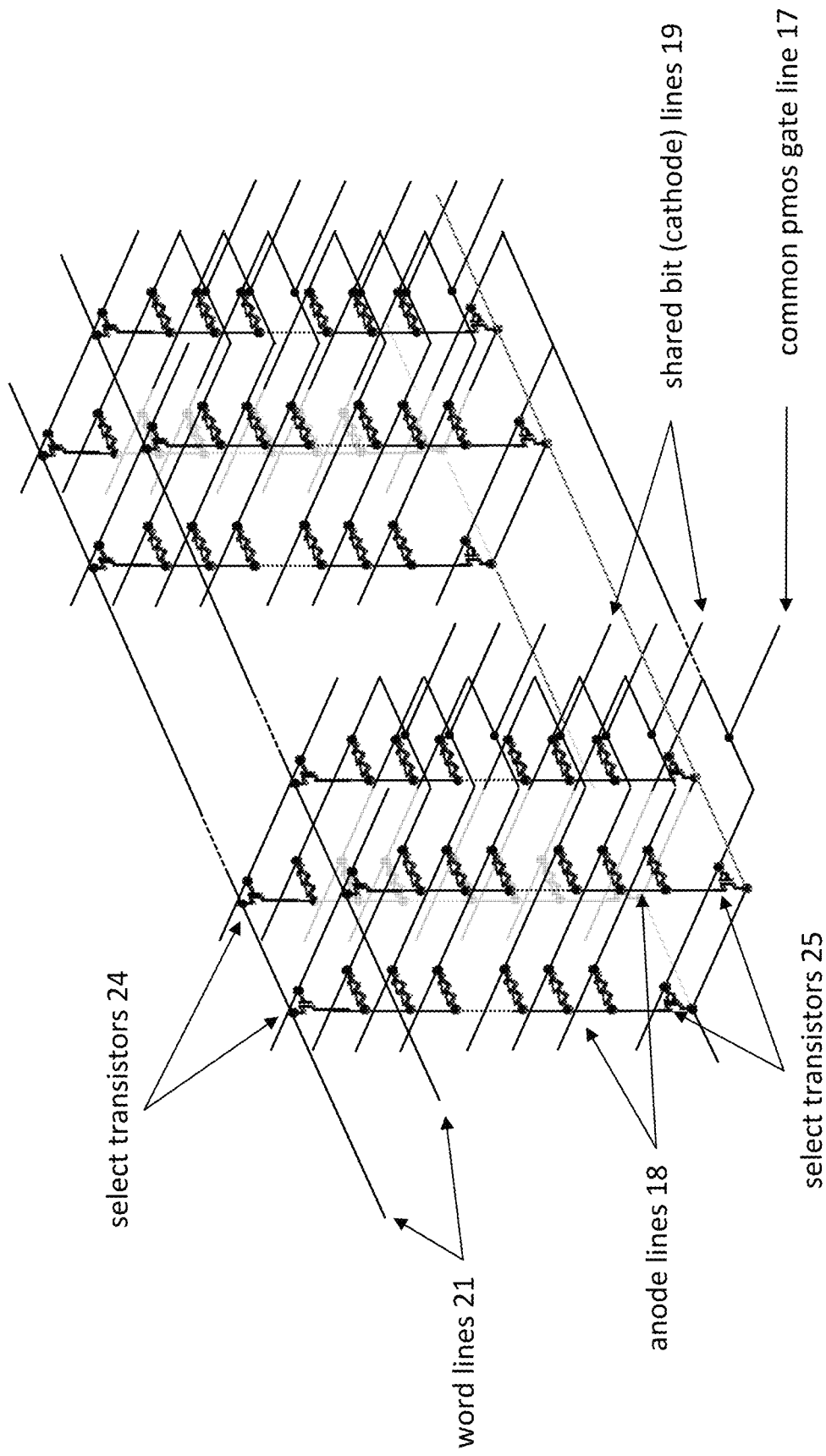
FIG. 3B is a circuit schematic of a memory array such as in FIG. 3A, but with shared bit lines, showing top and bottom select transistors for each string of thyristors.

FIG. 1 is a perspective view of an 8-layer stacked memory array in which the memory elements are thyristors. In FIG. 1 the dielectric material electrically isolating adjoining regions from each other has been omitted to reveal only the semiconductor, metal and metal silicide regions. The structure in FIG. 1 is formed using an n-conductivity type (herein n-type) semiconductor substrate 10, with pockets of strongly doped p+ conductivity type (herein p+-type) regions 40 near the surface. As will be shown more clearly in subsequent figures each memory element is provided by a pnpn thyristor with an optional assist gate. The figure illustrates a stack of eight layers of memory cells 15, however, commercial implementations of the memory array will have an arbitrary number of layers of memory cells, e.g. 64 or more layers. For a stack with a larger number of layers where bit lines (thyristor cathode lines) are shared in each layer, select transistors (shown in FIG. 2) are provided at the top and bottom of each string of memory cells to enable the unique selection of a particular cell and application of appropriate potentials for read and write operations. See FIGS. 3B and 3C. FIG. 1 is an implementation of the circuit shown in FIG. 3C. If the circuits of FIG. 3A or 3B are to be implemented, the assist gates and select transistors are eliminated as appropriate from the structure.

Vertical metal connections 18 couple the anodes of the memory cells in a string to word lines 21 in the upper portion of the structure. Bit line connections 19 to the cathodes of the thyristor memory cells extend laterally away from the cell array to vertical connections 13 upward to the surface of the device for connection to bit lines 11. An optional assist gate is provided for each thyristor and, if included, couples to assist gate lines 14 and 16 as will be shown in FIG. 3C.

In a typical implementation, the structure shown in FIG. 1 is the right half portion of a sub-array, with a left half portion of the sub-array being a mirror image of the illustration, extending away from the left edge of the structure shown in FIG. 1.

In FIG. 1 the memory cells are preferably thyristors, however, those of skill in the art will appreciate other types of memory devices may also be employed. For example, in other embodiments, phase change memory cells, fuses, anti-fuses, resistive elements or other memory cell types can be employed from the teaching of this invention.

FIG. 2 is a cross-sectional view along a word line 21 of the thyristor memory cell array shown in FIG. 1. FIG. 2 illustrates four stacks 15 each of eight thyristors. Each stack of eight thyristors includes a pair of select transistors to enable accessing only one string of thyristors if a shared bit line architecture is implemented. An nmos select transistor 24 is at the top of each string of thyristors and a pmos select transistor 25 is at the bottom of each string. The arrows to these transistors point to the channel regions of the transistors. Each of the select transistors has a vertical gate most easily seen by the thin layer of gate insulating material near the points of the arrows to the transistor channel regions. The horizontal layers to the right of the gate insulating layers provide electrical connections 28 and 29 to the gates.

The vertical metal contact 18 to the anodes of each string of eight thyristors is shown at the left edge of the figure and extends upward to connect to the word line 21 when the select transistors 24 and 25 are on. A metal contact 27 connects to each thyristor cathode. The cathode lines 19 are not shown in this cross-section, but extend into and out of the plane of the figure, as shown in FIG. 1.

Figure 3C:
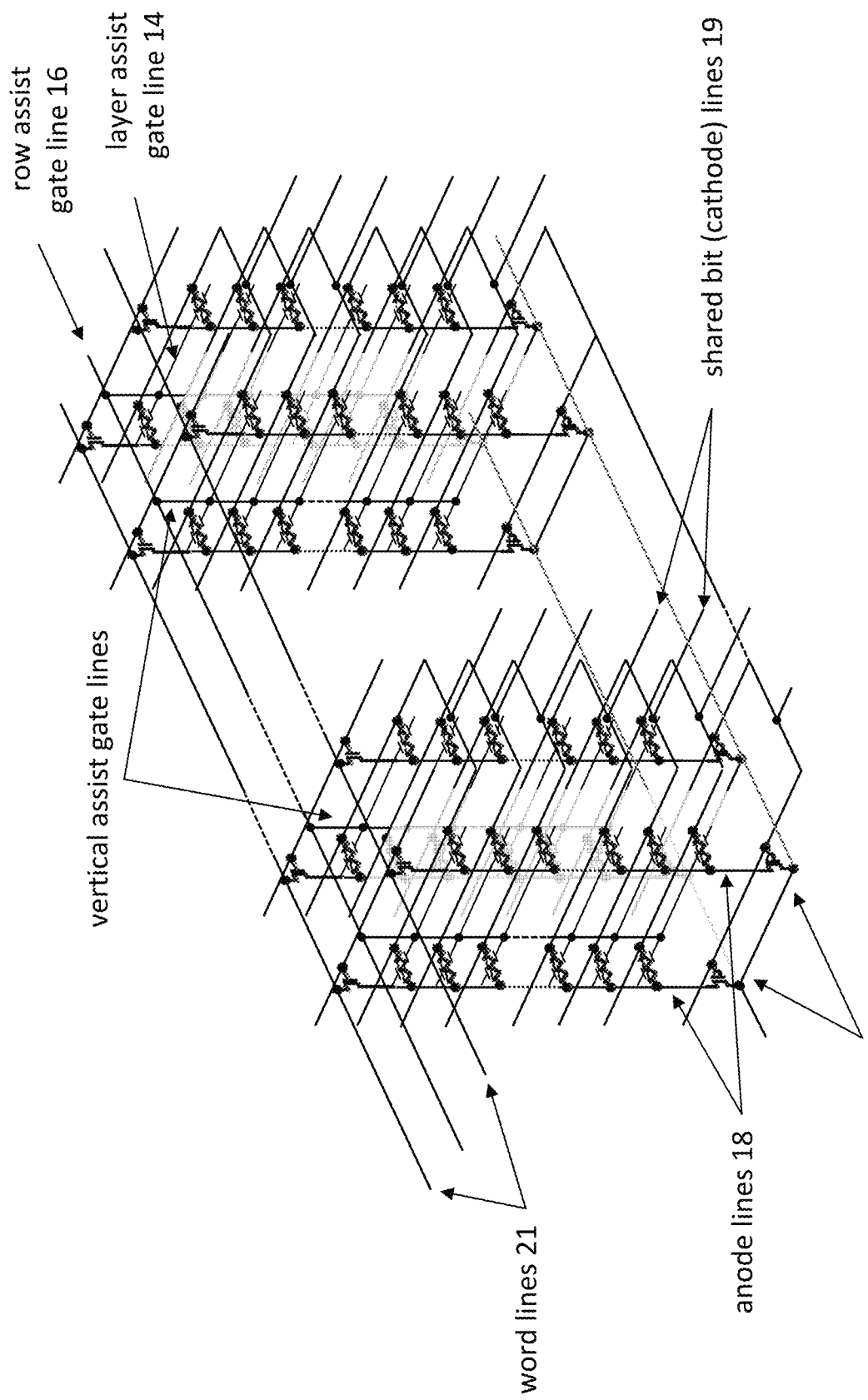
FIG. 3C is a circuit schematic of a memory array such as in FIG. 3B, but in which each thyristor has an assist gate, and the connections to those assist gates.

FIGS. 3A, 3B and 3C are circuit schematics of a portion of a memory array implemented as shown in FIG. 1 with thyristors 20 as memory cells. FIG. 3A shows the row (x), column (y) and string (z) directions. In FIG. 3A only a very small portion of a memory array is shown, one with two word lines coupled to eight strings of memory cells. In a typical commercial implementation there will be billions of memory cells. Each thyristor 20 comprises a pnpn (or npnp) semiconductor device without an assist gate (FIGS. 3A and 3B) or with an assist gate (FIG. 3C) coupled to one of the thyristor base regions. The anodes of thyristors in one string of the array are coupled together by an anode line 18. The cathodes in one row of the array are commonly connected to a bit (or cathode) line 23.

FIG. 3B illustrates an array such as shown in FIG. 3A, but with a common pmos select transistor line 17 and shared bit lines 19. In this implementation, upper select transistors 24 at the top of each column and lower select transistors 25 at the bottom of each column of a common anode line are used to enable selection of only one string of the two strings shared by one bit line coupled to the same word line 21.

FIG. 3C illustrates the addition of assist gates to the thyristor memory cells of FIGS. 3A and 3B and their associated connecting lines. An assist gate is associated with a base region of each thyristor 20. The assist gates are connected to a layer assist gate line 14 in the column line direction of each layer of memory cells. Vertical assist gate lines extend through the array vertically with each vertical line connected between two assist gates. The vertical lines, in turn, are connected to row assist gate lines.

The techniques for operating the thyristor memory arrays illustrated, including reading data from the array, writing data into the array, and refreshing data stored in the array, are described in commonly assigned U.S. Pat. No. 9,564,199, entitled "Methods of Reading and Writing Data in a Thyristor Random Access Memory," incorporated by reference herein.

Figure 4:
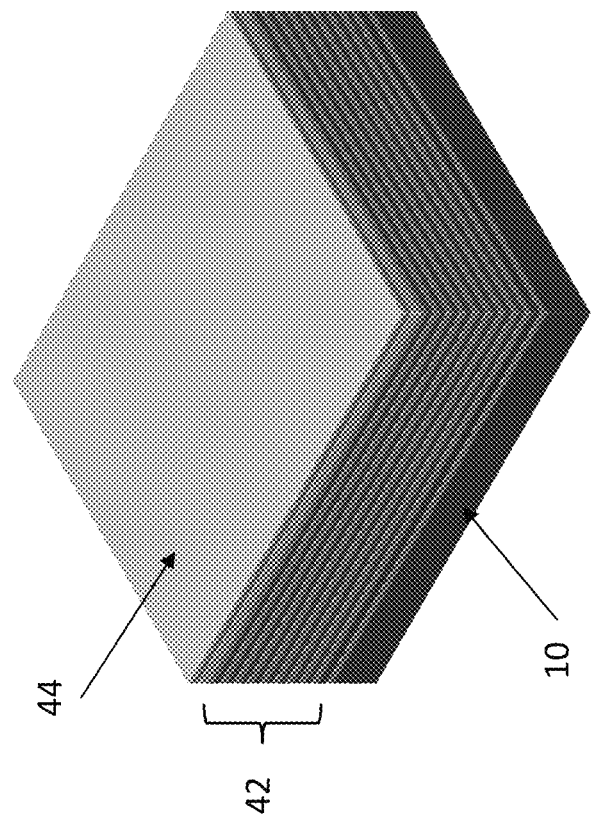

FIG. 4, et seq., illustrate a preferred process for fabricating the structure shown in FIGS. 1 and 3. FIG. 4 shows the structure after initial steps of fabrication. Beginning with a semiconductor wafer 10 a p+ type implant step is performed in the area of the cell array. The implanted regions 40 shown in FIG. 1 provide a common electrical connection to the pmos select transistors at the bottom of each column of thyristors.

Next a silicon dioxide layer 54 and a polysilicon layer 52 (see FIG. 6B) are deposited. Following that, alternating layers 42 of silicon nitride and silicon dioxide are deposited. The number of layers deposited determines the number of layers of memory devices to be formed, with one layer of silicon nitride deposited for each layer of memory cells. After the last layer of silicon dioxide, a layer of polysilicon 56 is deposited. Then another layer of silicon dioxide is deposited, followed by a hard mask layer 44, for example, a metal oxide such as $Al_2O_3$.

Figure 5:
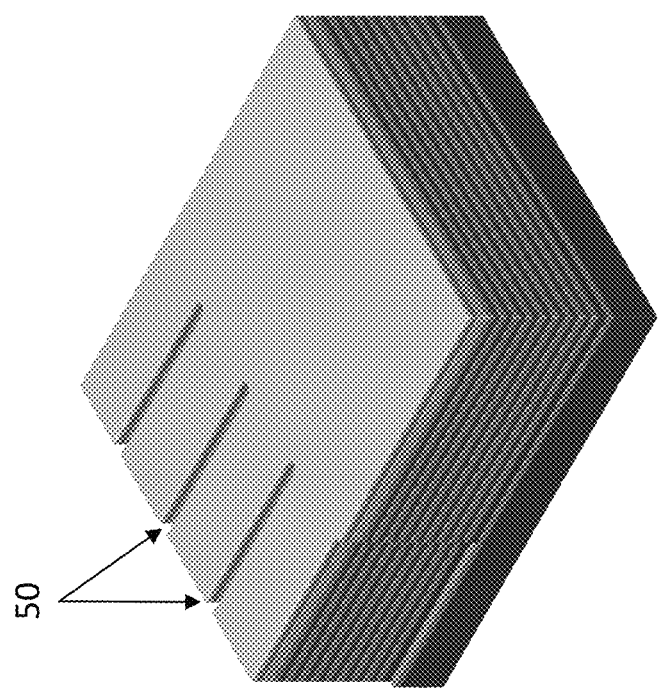
Figures 6A, 6B:
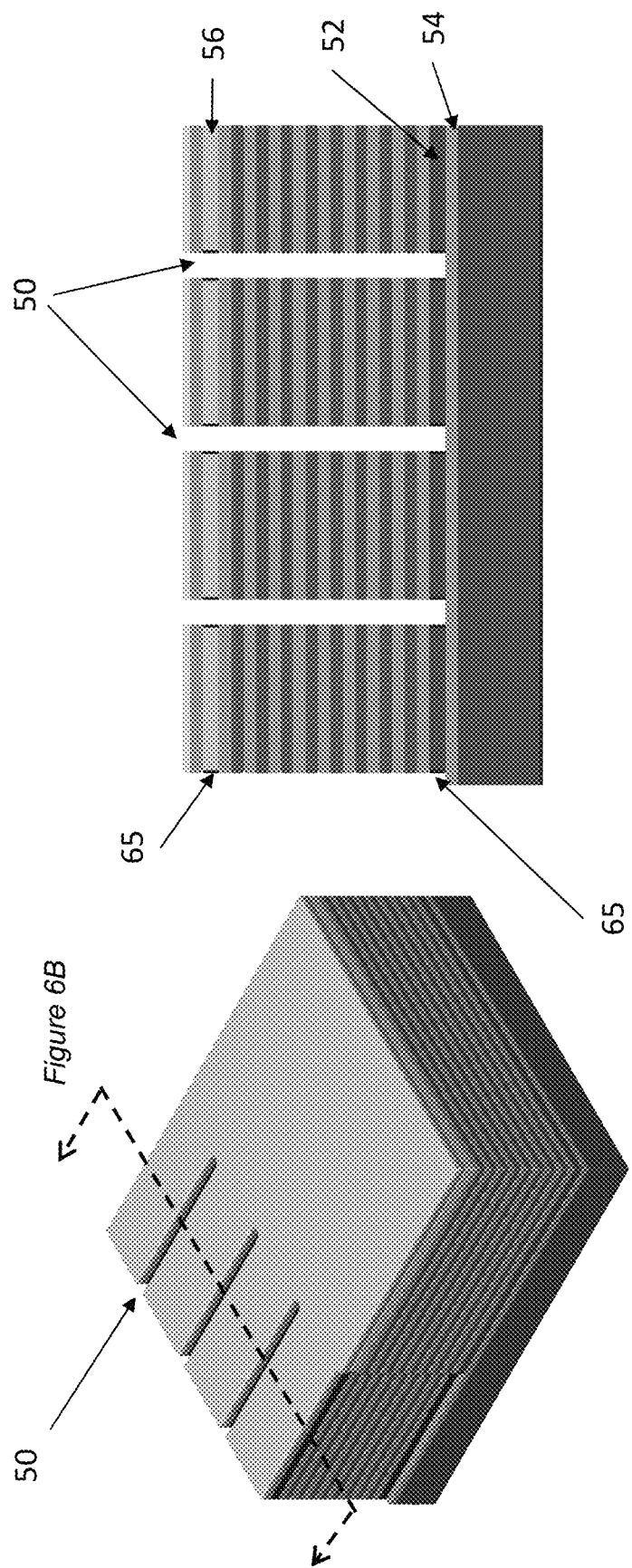
FIGS. 6A and 6B illustrate gate oxide formation.

Using conventional photolithography, repeated known etching processes are used to remove the sequential layers of silicon dioxide and silicon nitride to form slots 50 extending through all of the layers down to layer 54 (shown in FIG. 6B). These slots will partially separate groups of memory cells from each other. The appearance of the structure after etching the slots 50 is shown in FIG. 5.

FIGS. 6A and 6B illustrate the next steps in the fabrication process. The exposed polysilicon lines 52 and 56 are recessed by 3 to 6 nm with an isotropic etch and the exposed sidewalls of the slots are then oxidized. The oxidation of polysilicon forms the gate oxide 65 for the pmos and nmos select transistors on the exposed edges of the polysilicon layers.

Figure 7:
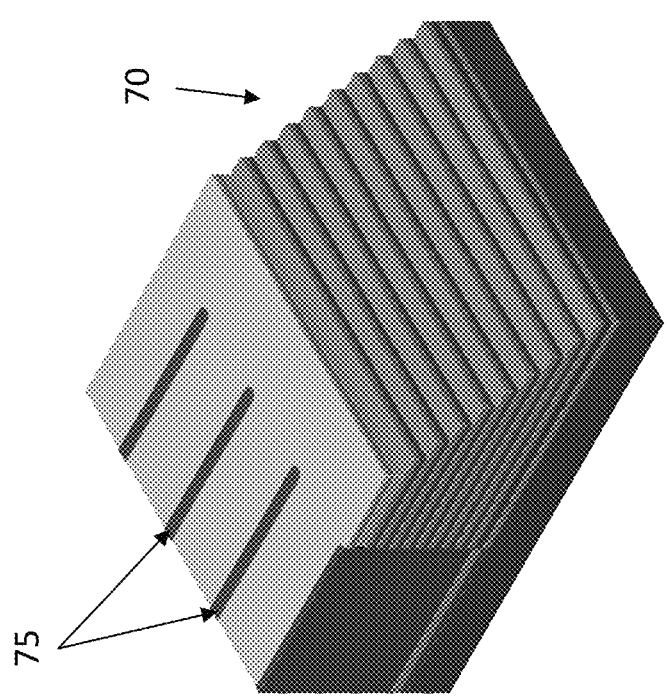

As shown in FIG. 7, after the bottom silicon dioxide is etched away to expose the underlying single crystal silicon, crystalline silicon 75 is grown in slots 50. Selective epitaxial growth (SEG) of silicon is a well-known technology, with chemistries such as dichlorosilane and HCl often used. It is desirable to grow the silicon to be planar with the hard mask. Alternatively, SEG silicon can be over grown above the hard mask and then chemical mechanical polishing (CMP) used to remove the excess silicon above the hard mask. The structure is then coated with a thick photoresist, patterned and etched using progressive photoresist trimming.

For an eight-layer memory array, after 8 "loops" of photoresist trim and oxide/nitride etching, the staircase structure 70 results, as shown in FIG. 8A. Each step (layer) in the "stairs" will connect one node of a sub-array of columns of memory cells in that layer to an external connection for accessing those memory cells. In the preferred embodiment the stepped layers enable bit line electrical connections to the thyristor cathodes. The exposed portion of each successively lower step provides area for a via type connection from the upper surface of the integrated circuit to the exposed portion of that step.

Figure 8:
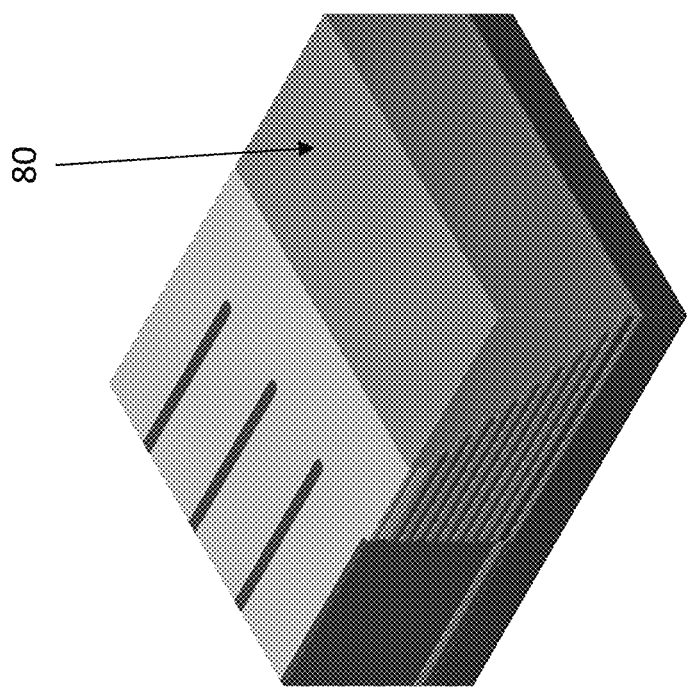

Next as shown in FIG. 8, a thick layer of dielectric material 80, e.g. silicon dioxide, is formed over the entire structure and planarized. In a preferred process the planarization step used here and in subsequent operations uses chemical mechanical polishing (CMP).

Then as shown in FIG. 9A, further masking and etching steps create slots 90a and 90b. Slots 90a are aligned to cut the layer stack along the SEG silicon fence 75. Slots 90b partially cut the staircase structure orthogonally to slots 90a. Slots 90a and 90b are formed using well-known reactive ion etching (RIE) and optionally extend slightly into the semiconductor substrate 10 as shown in FIG. 9B.

Figure 10B:
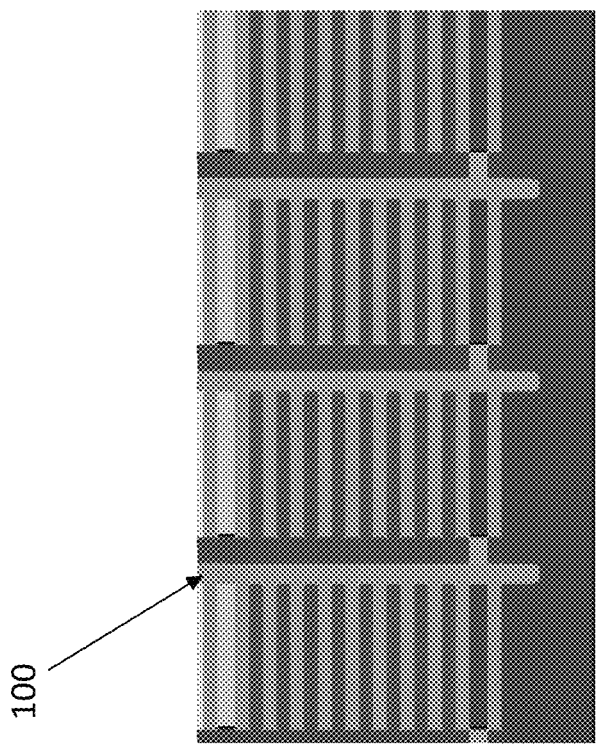
FIGS. 10A and 10B illustrate silicon dioxide fill and planarization.
Figure 10A:
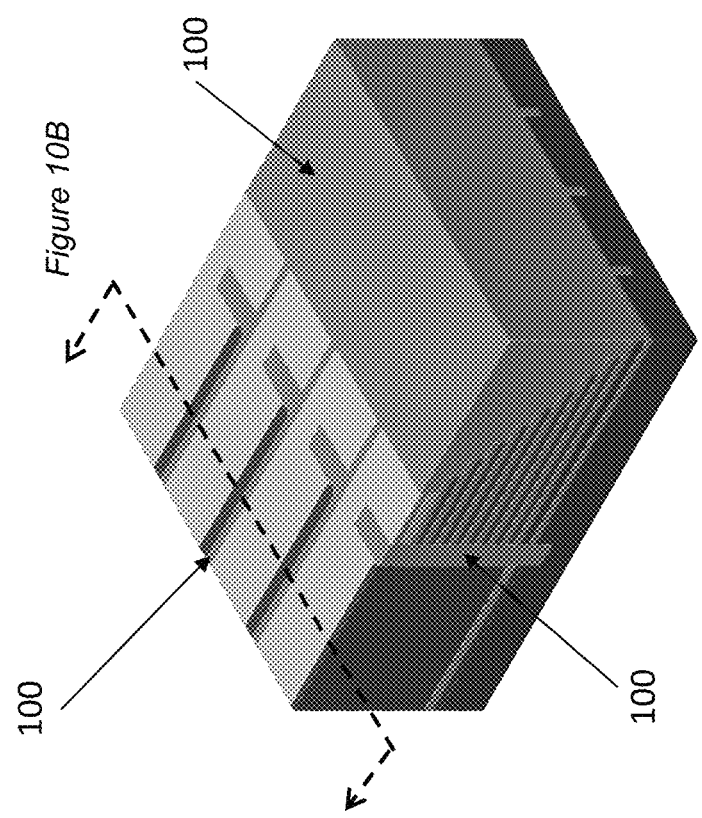

Next, as shown in FIG. 10A, slots 90a and 90b are filled with silicon dioxide 100. Then the structure is again planarized with a CMP process. FIG. 10B is a cross-sectional view after planarization.

Figure 11B:
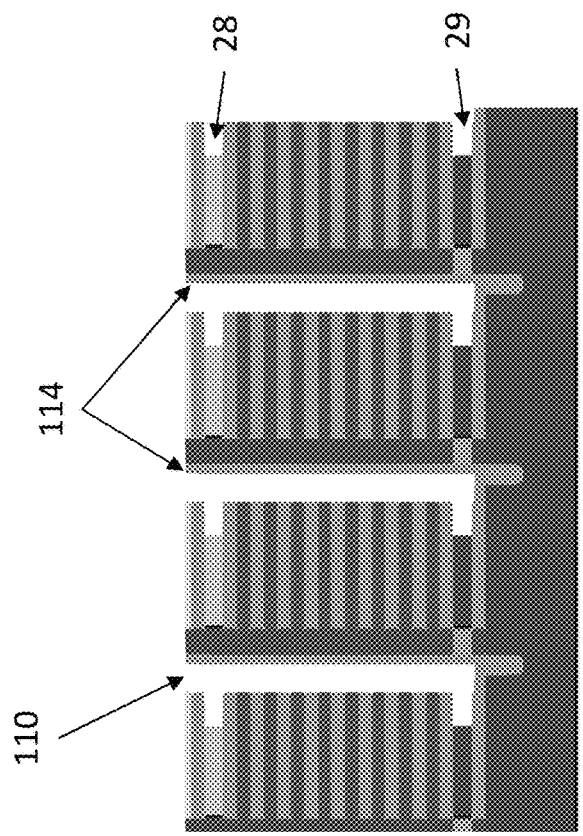
FIGS. 11A and 11B illustrate recess etching of select transistor gate connections.
Figure 11A:
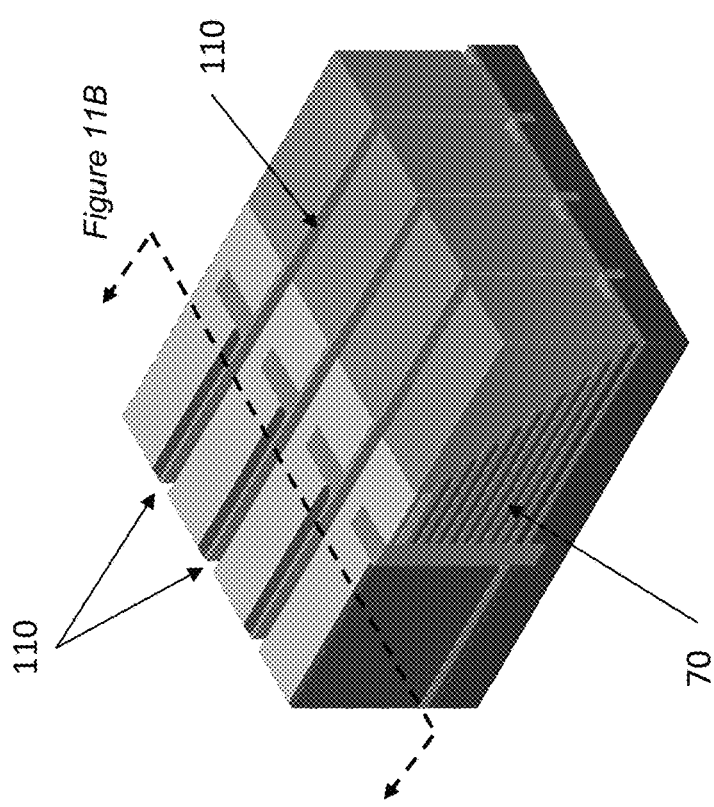

After masking and lithography another set of slots 110 is etched through all the layers down to the bottom layer of silicon dioxide, as shown in FIG. 11A. These slots 110 will enable formation of the thyristor or other type memory cells. Note that the mask defining the location of slots 110 is aligned to leave a vertical layer of silicon dioxide 114 on the sidewall. This insulating layer 114 prevents a subsequent epitaxial growth of silicon process from forming single crystal silicon along that sidewall. Following this step, as shown in FIG. 11B, exposed edges of polysilicon connections 28 and 29 to the gates of the select transistors are etched back to leave space for self-aligned metal formation. This provides lower resistance select transistor gate connections.

Next, as shown in FIGS. 12A and 12B, a thick oxide of 10 nm to 100 nm is grown on exposed silicon surface before the multiple layers of silicon nitride are etched away. A wet etchant isotropically removes all exposed silicon nitride between the layers of silicon dioxide 120, both in the memory cell area (FIG. 12B), and in the staircase area (FIG. 12A). The openings 122 between the layers of silicon dioxide 120 after silicon nitride removal in the memory cell area are shown in FIG. 12B. The remaining silicon dioxide layers are supported along two edges to provide mechanical structural strength.

Figure 13B:
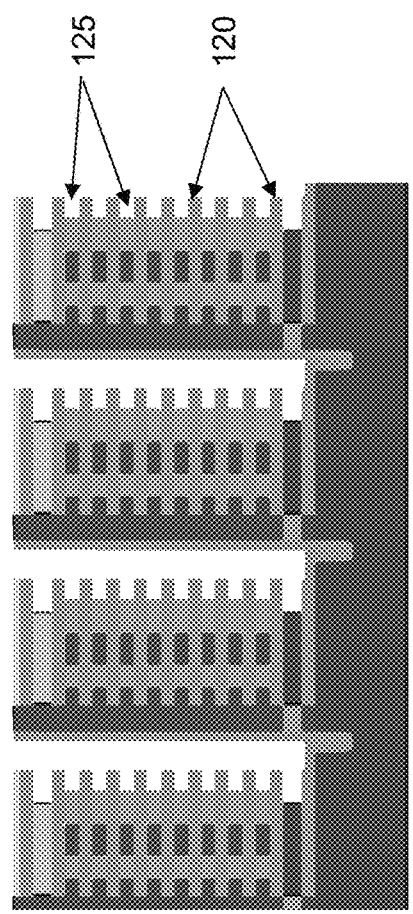
FIGS. 13A and 13B illustrate thyristors formed by confined epitaxial lateral overgrowth of silicon.
Figure 13A:
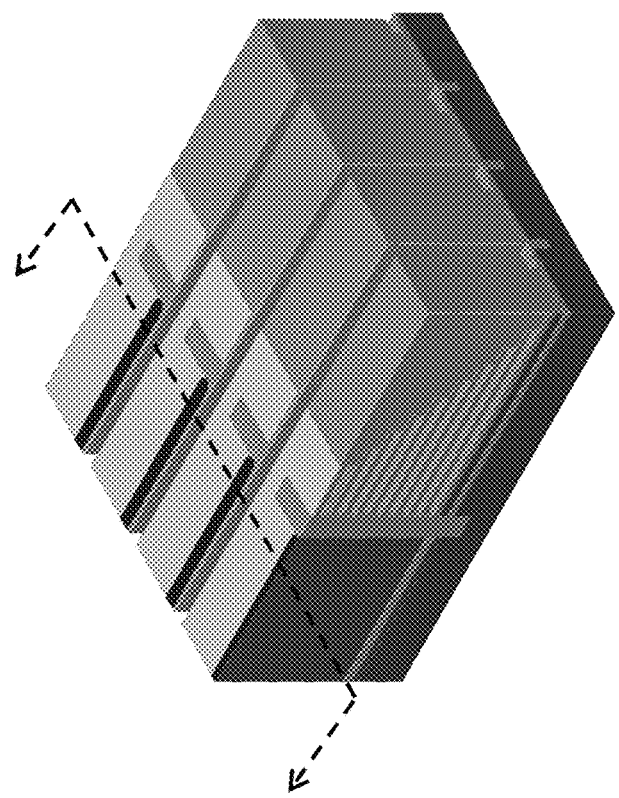

Following these processes, confined epitaxial lateral overgrowth of silicon is used to form memory cells in the cell area of the array. The epitaxial growth is selective only to regions with exposed SEG silicon seed crystal. As the process proceeds appropriate conductivity type dopants are introduced into the gas flow to create the desired conductivity type structure for whatever type memory cells are to be formed in the array. This process forms single crystal silicon in the openings 122 between the layers 120. In the embodiment with thyristors memory cells, the sequential dopants are p+-type, n-type, p-type, and n+-type providing the lateral thyristor anode, bases, and cathode, respectively. FIG. 13B shows the cross sections of the thyristors 125 formed in the openings 122 between layers 120.

In an alternate embodiment with thyristor memory cells, instead of confined epitaxial lateral overgrowth of silicon being used for all four of the pnpn regions, silicon is used to form the cathode and anode regions, and a semiconductor material with narrower energy bandgap (<1.12 eV) is used to the form the p and n conductivity type base regions. This bandgap engineering is advantageously used to improve the pnpn thyristor switching characteristics, standby stability, disturb tolerance, and temperature operating window. One type of narrower bandgap semiconductor material is silicon-germanium ($Si_{1-x}$ $Ge_x$) where x is the germanium mole fraction. The energy bandgap of $Si_{1-x}$ $Ge_x$ can be linearly varied from 1.1 eV to 0.7 eV by increasing Ge mole fraction. The silicon-germanium base regions permit the thyristor memory cell to turn on at lower voltages than a similar structure having silicon base regions. See, e.g. commonly assigned U.S. patent application Ser. No. 15/807,536, filed Nov. 8, 2016, and entitled "Vertical Thyristor Cell and Memory Array with Silicon-Germanium base Regions."

The n-type and p-type silicon-germanium base regions preferably have a constant germanium composition of 2-30% mole fraction. Alternatively, the germanium composition in the alloy of the two base regions may vary. The germanium fraction may be linearly graded such that germanium mole fraction is low near the middle n-base/p-base junction and higher towards both the anode and the cathode junctions. The result is that the bandgap is large at the middle junction and and smaller at the anode and cathode junctions. As a result, band-to-band tunneling is reduced during the switch-on and standby operations, improving cell stability. On the other hand, the heterojunction at the anode and cathode still increase emitter efficiency and therefore thyristor loop gain. Another variation in the silicon-germanium composition reverses the linear grading so the germanium mole fraction near the middle junction is high and the germanium mole fraction near both the anode and cathode junctions is low, reducing band-to-band tunneling leakage during the turn-off operation and helping cell turn-on at low temperatures. Pseudomorphic SiGe is typically grown by switching on germane (GeH4) gas in addition to silicon precursors such as $SiH_4$ or SiH2Cl2 and dopant gases such as diborane ($B_2H_6$), phosphine ($PH_3$), or arsine ($AsH_3$).

Figure 14:
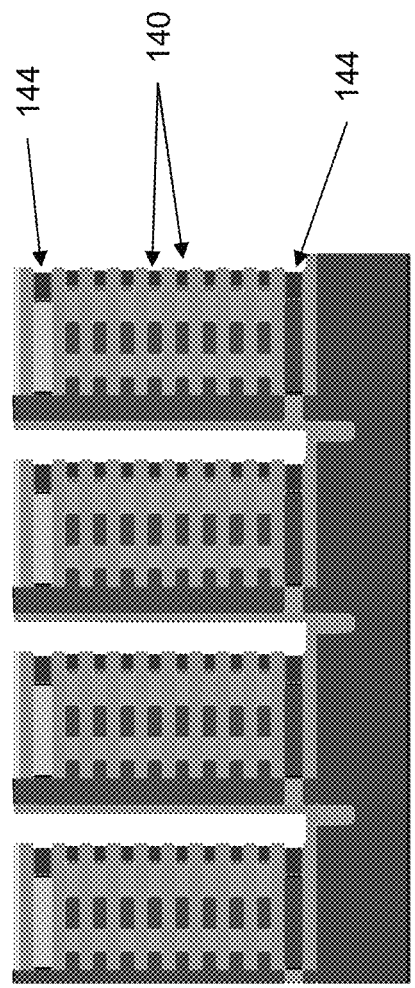
Figure 16:
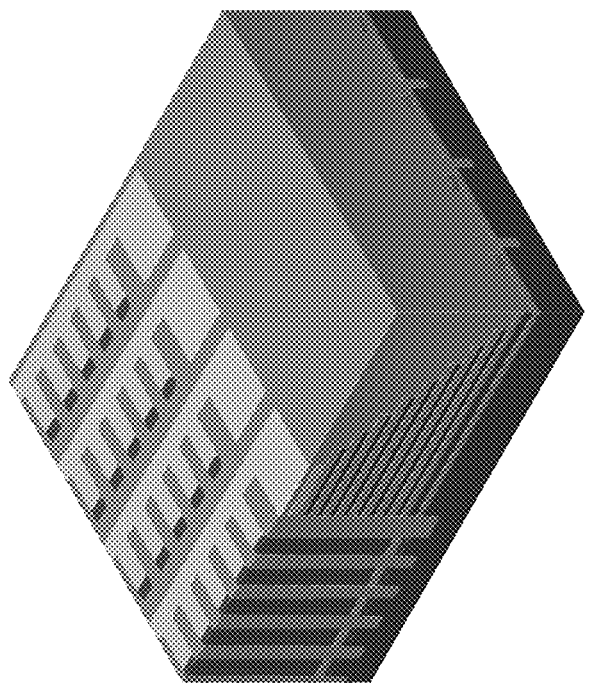

A metal contact formation process then provides electrical connections 140 to the thyristor cathodes and connections 19 to the select transistor gates 144, as shown in FIG. 14. In this process a transition metal, e.g. cobalt, titanium, or nickel, is deposited and annealed to form metal silicide contacts to the thyristors. Next a conductive metal layer, e.g. tungsten, is conformally deposited, and then isotropically etched back to provide low resistance contacts to the metal silicide. The process forms not only the direct connections to the thyristors 125, but also the connections 19 extending laterally away from the thyristors to create the staircase of cathode connections shown in FIG. 1.

Figure 15:
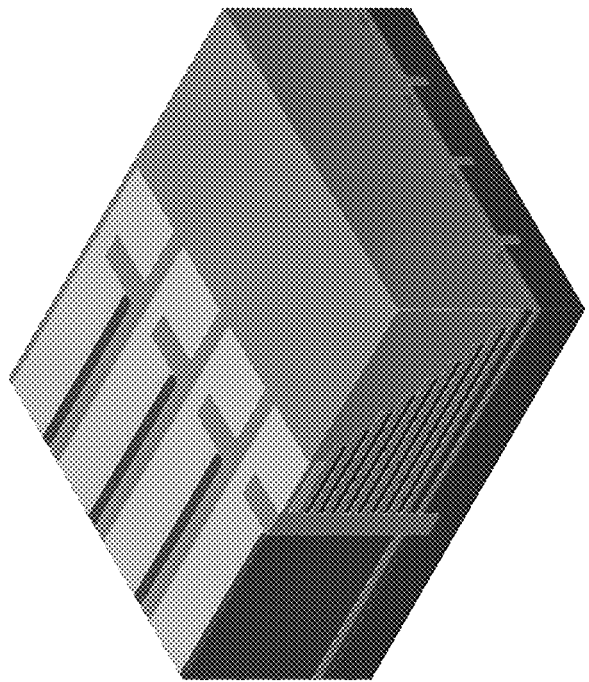

As shown by FIG. 15, the structure is then filled with silicon dioxide and planarized by a CMP process. A new mask and further etching processes separate the thyristor regions into separate memory cells as indicated by a comparison of FIG. 16 with FIG. 15. After that, the structure is again filled with dielectric material and planarized.

Figure 18:
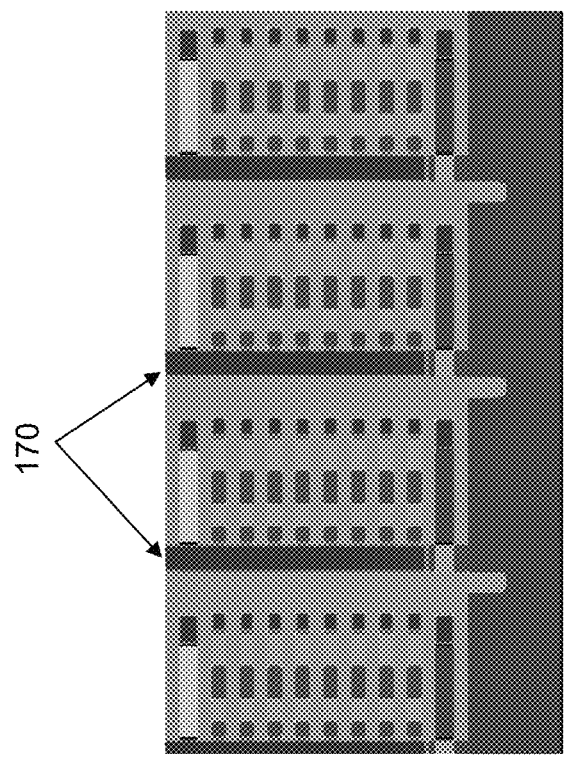
Figure 17:
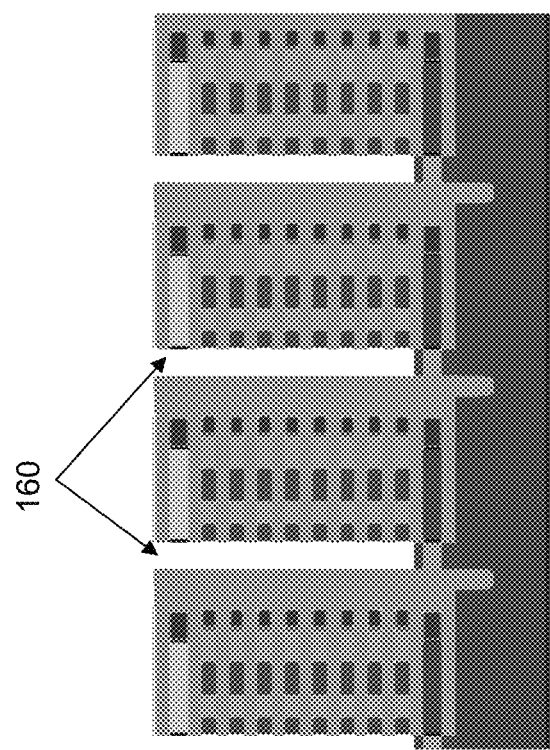
Figure 19B:
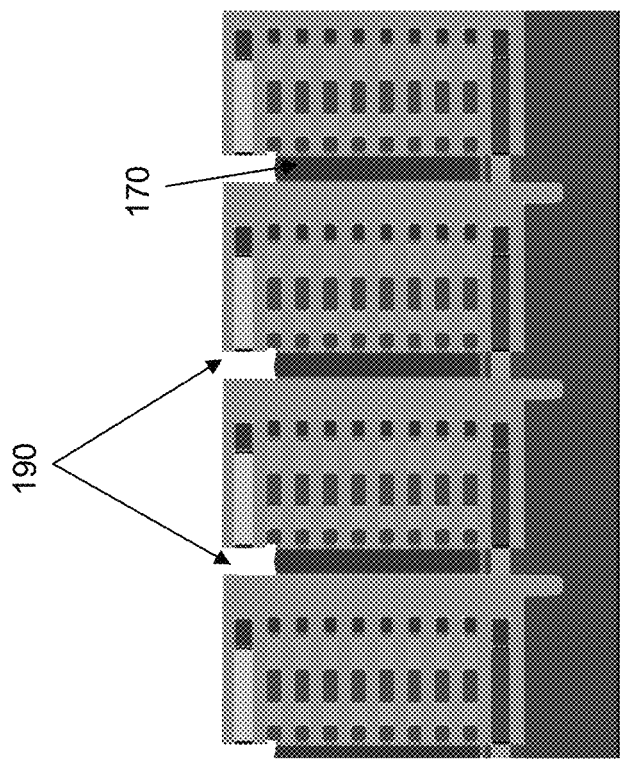
FIGS. 19A and 19B illustrate etch back of the connections shown in FIG. 18.
Figure 19A:
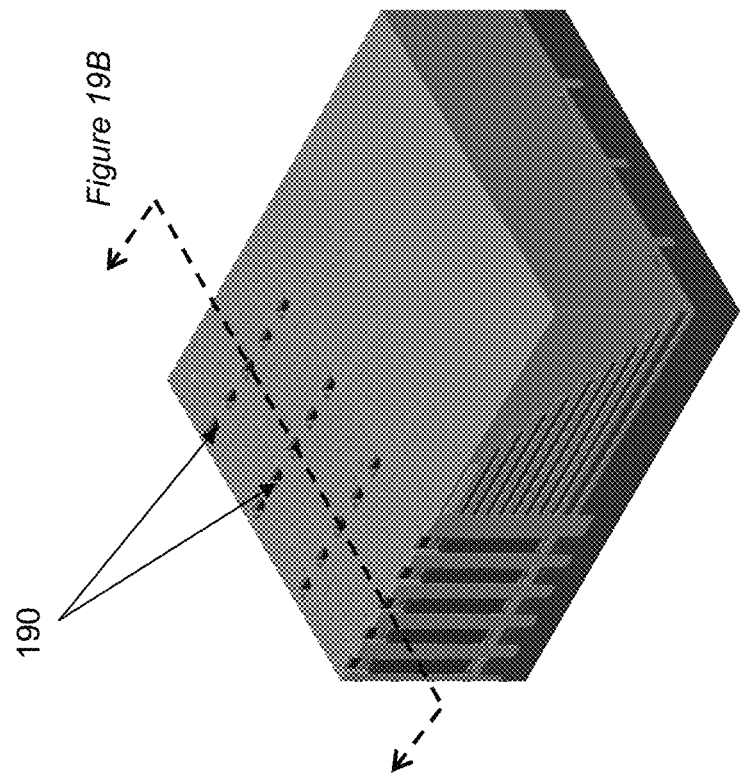
Figure 20:
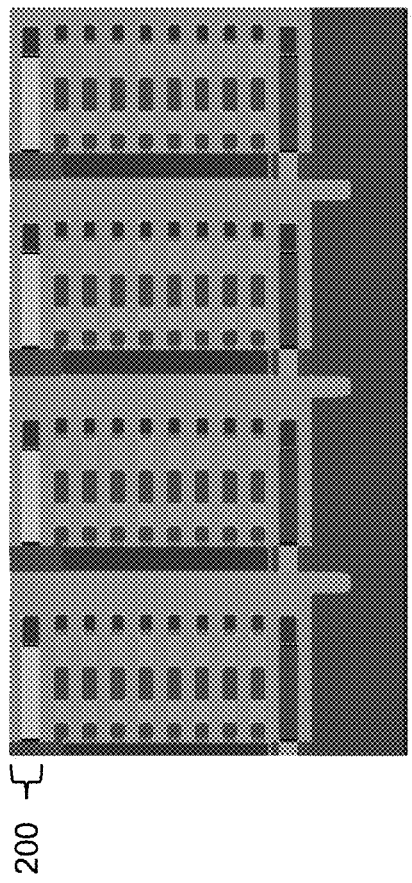

Next as shown in the cross section of FIG. 17, a silicon etch is used to remove the SEG silicon adjoining the anodes of the thyristors, forming slots 160. Note that the slots 160 do not extend all the way down to the substrate, but stop short of the pmos select transistors near the bottoms of the slots. Then a metal contact process like that described above is used to form metal silicide connections 170 to the thyristor anodes in each stack as shown in FIG. 18. The structure is again planarized, e.g. using a CMP process.

Next the electrical connections 170 previously formed are etched back, thus recessing the silicide and metal connections and providing space for the select transistor to be formed at the top of that string. The recesses are shown as small holes 190 in FIG. 19A, and as recessed regions 190 in the cross section of FIG. 19B.

Following this step, selective epitaxial growth 200 with n+, p and n-type dopants is used to form the source, channel and drain regions of the nmos select transistor at the top of each string of memory cells. This completes the formation of the memory array structure. Well-known further processing as described provides electrical connections to the desired regions of the memory array. See the discussion below with respect to FIG. 23-25.

Figure 21B:
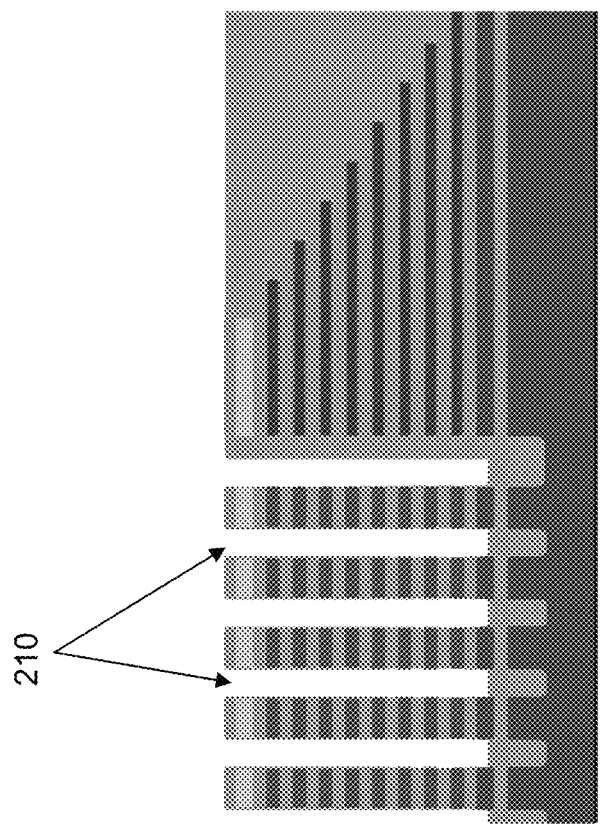
FIGS. 21A and 21B illustrate etching openings for assist gates.
Figure 21A:
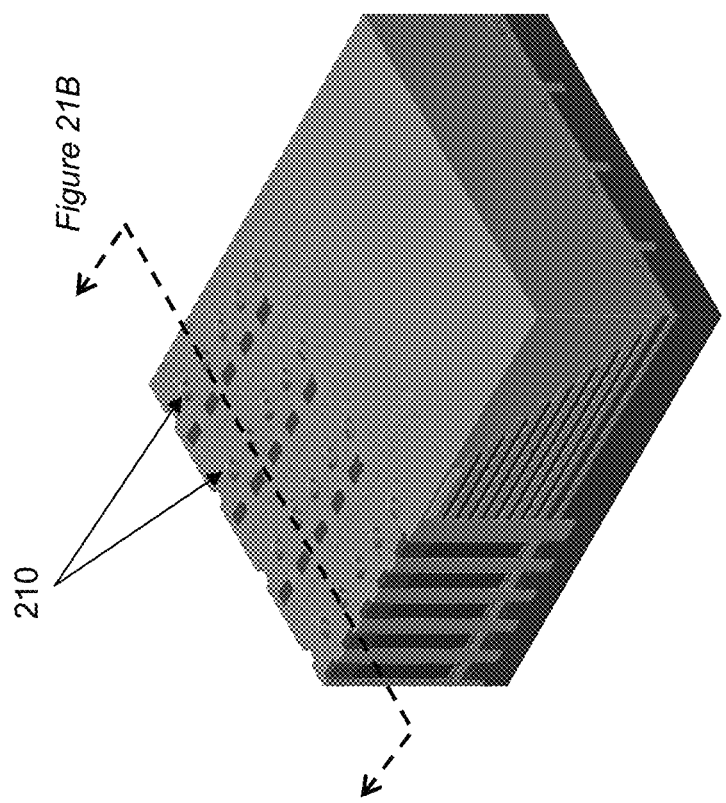
Figure 22:
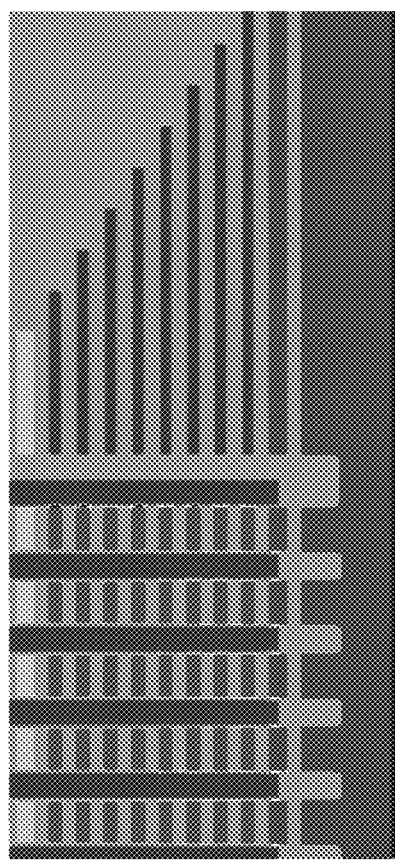

In implementations of the three-dimensional memory array when thyristors are used as memory cells, it may be desirable to also provide an assist gate for at least one of the base regions of each thyristor. A modification of the process described above provides such assist gates. This process is shown in FIGS. 21 and 22.

This process uses the same steps described above up through FIG. 16. After the thyristors are divided, a new mask defines the locations for where the assist gates will be formed. As shown in FIGS. 21A and 21B, holes 210 are then etched through all of the layers. A thin layer of gate oxide is then grown on the sides of the holes to isolate the assist gates from the thyristors. Next atomic layer deposition of a titanium nitride barrier is performed, followed by a conformal deposition of tungsten. The tungsten provides the assist gate for each thyristor. A CMP process is then used to planarize the upper layer of the structure. FIG. 22 is a cross section of the structure along the assist gate line.

Figure 24:
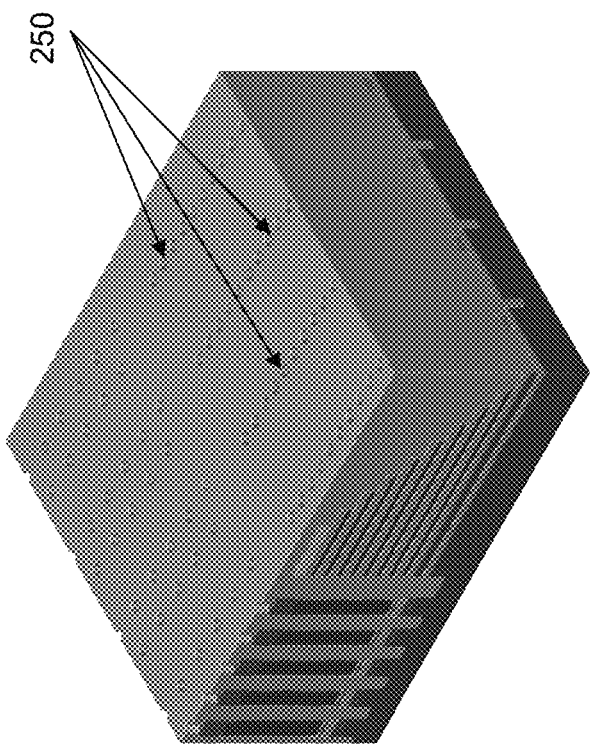
Figure 23:
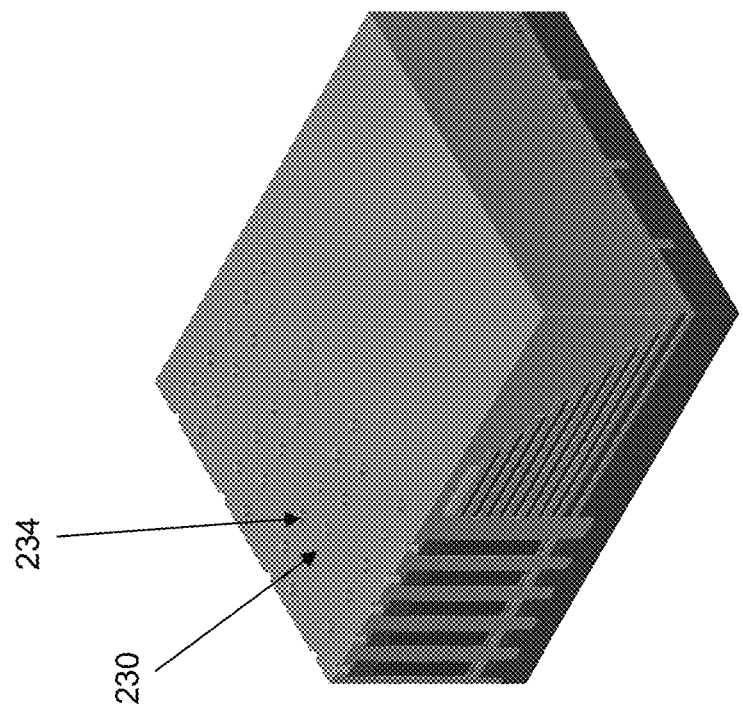
Figure 25:
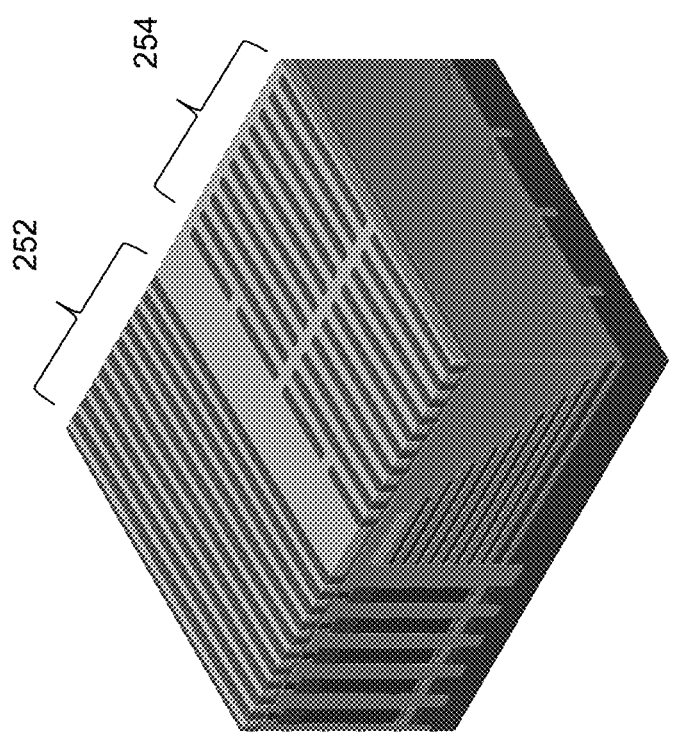

FIGS. 23-25 illustrate the final processes used to provide electrical connections to the memory array. As shown in FIG. 23 dielectric material is deposited and another CMP process prepares it for anode 230 and assist gate 234 connections, shown as small openings on the upper surface of the illustration. Next further masking and etching steps are performed to provide electrical connections to the staircase of cathode connections. These openings 240 are shown in FIG. 24.

FIG. 25 illustrates the next aspect of the process in which first layer metal electrical connections to the memory cells are provided. In FIG. 25, with thyristor memory cells, connections 252 are formed using well-known technology to electrically connect to the anodes of the memory cells. Connections 254 connect to the cathodes and assist gates of the thyristors.

Figure 26:
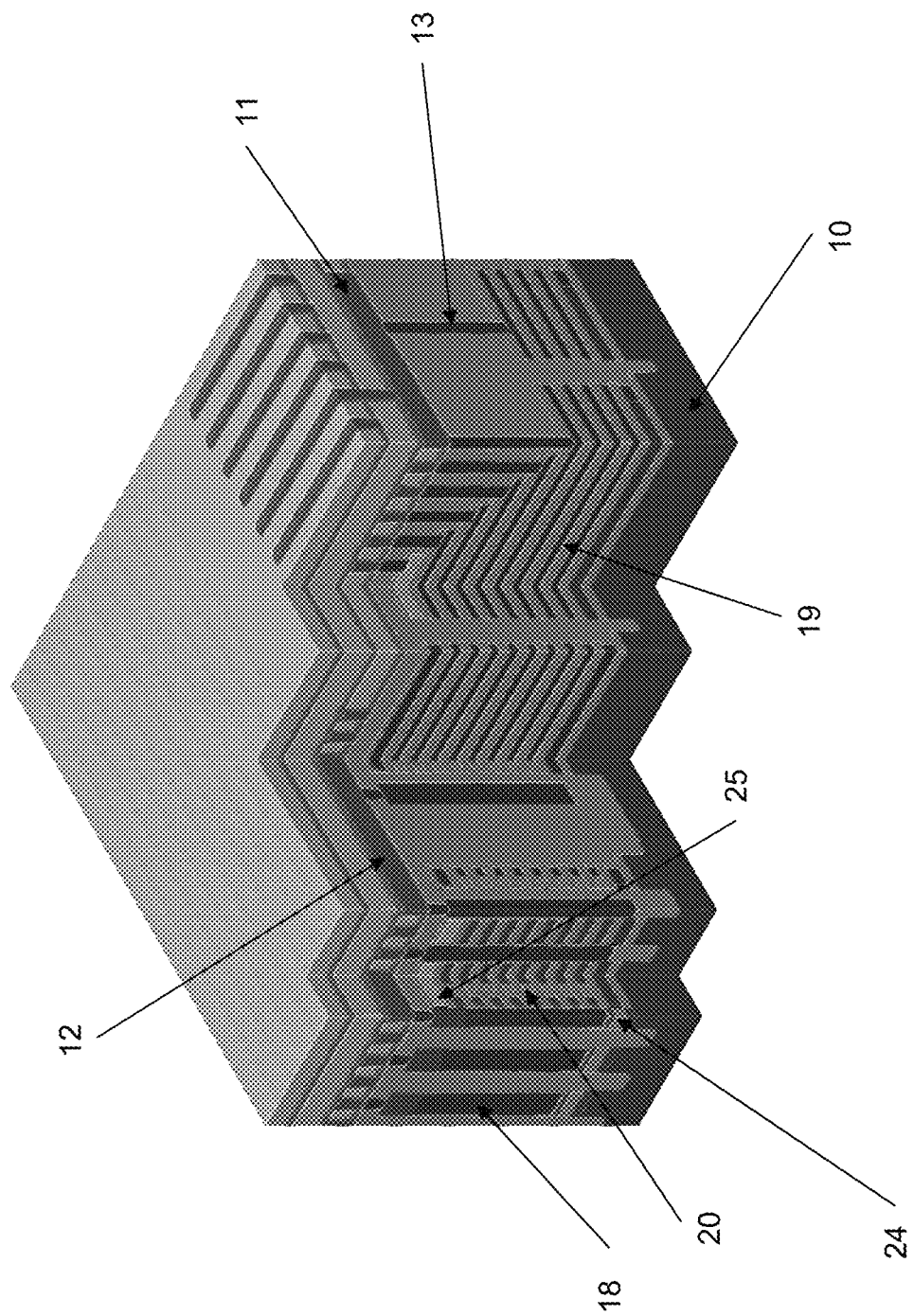
FIG. 26 is a perspective view of the completed memory array including second layer metal lines.

FIG. 26 is a perspective view illustrating the completed memory array after formation of second layer metal connections. In FIG. 26 portions of the structure have been "cut away" to show various regions within the thyristor based structure. These regions include substrate 10, vertical anode connections 18, word (anode) lines 12, staircase cathode connections 19, vertical connections 13 to the cathode lines 19, thyristors 20, pmos select transistor 24, and nmos select transistor 25.

In practical implementations of the memory array described above, peripheral circuitry is provided on the same semiconductor die as the memory array. The peripheral circuits enable addressing memory cells, writing data into the memory, reading data out from the memory array, as well as providing other functions.

Figure 27:
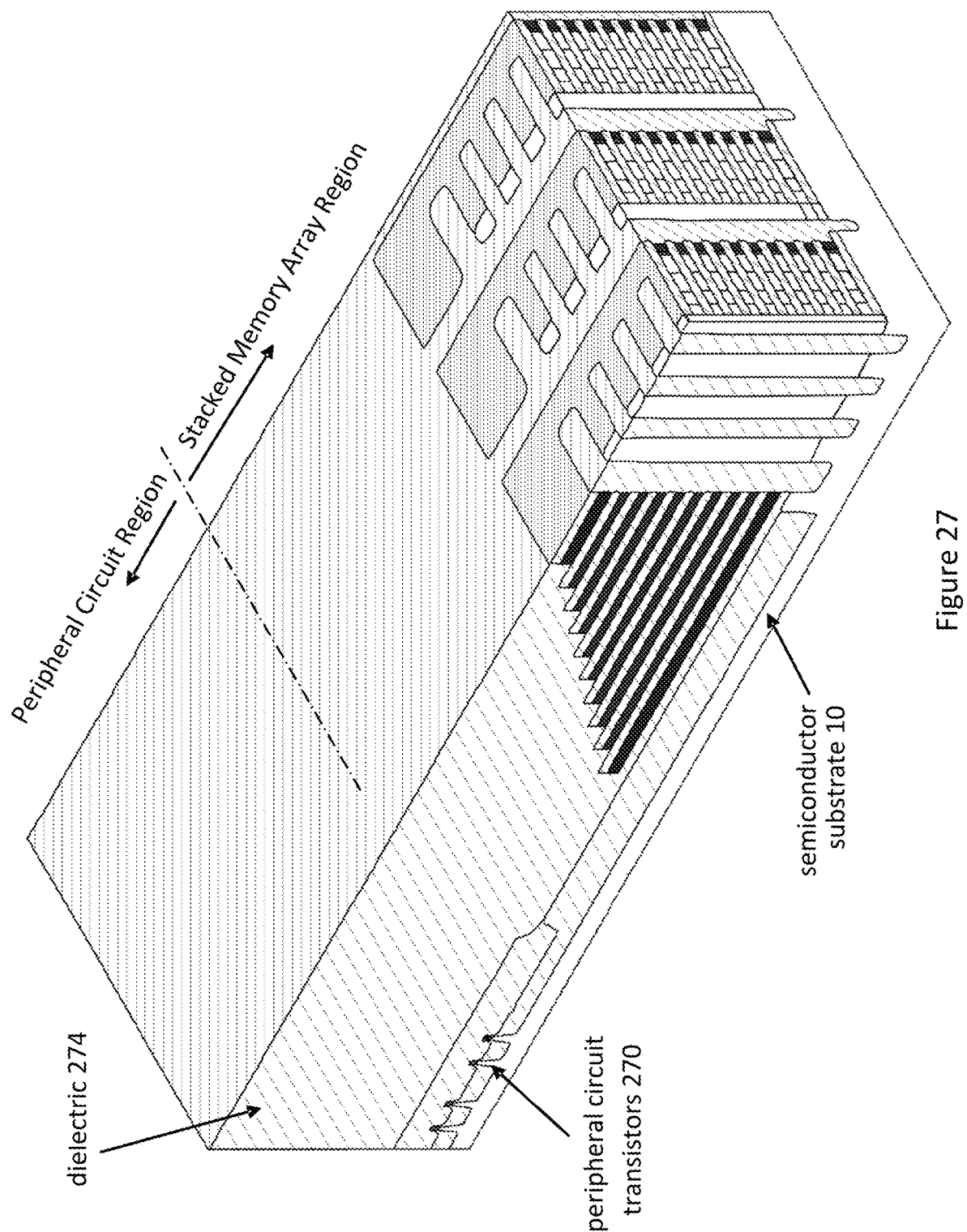

FIG. 27 illustrates a first approach to the provision of peripheral circuitry. As shown transistors 270 and other electronic devices used in the peripheral circuitry are formed on a lower layer of the semiconductor structure before formation of the layers used in the memory array. This peripheral circuitry can be implemented using conventional planar CMOS transistors, FinFet (or Tri-Gate) transistors, as well as other well-known devices. After formation of the peripheral circuitry, a thick dielectric layer 274 covers the peripheral circuitry providing a coplanar upper surface for interconnections to the peripheral circuitry and between that circuitry and the memory array. This is commonly done by chemical-mechanical planarization. The approach illustrated in FIG. 27 is an alternative embodiment. While some connections between the memory array and the peripheral circuit may be provided under dielectric 274, care must be taken for their stability by controlling the thermal budget of subsequent process steps. As a result, deep electrical connections (not shown) from the upper surface of dielectric 274 are often needed to connect to the peripheral transistor gates, sources and drains. With such deep connections, small contact pitch and low contact resistance become increasingly difficult to achieve reliably as more memory cell layers are stacked.

Figure 28:
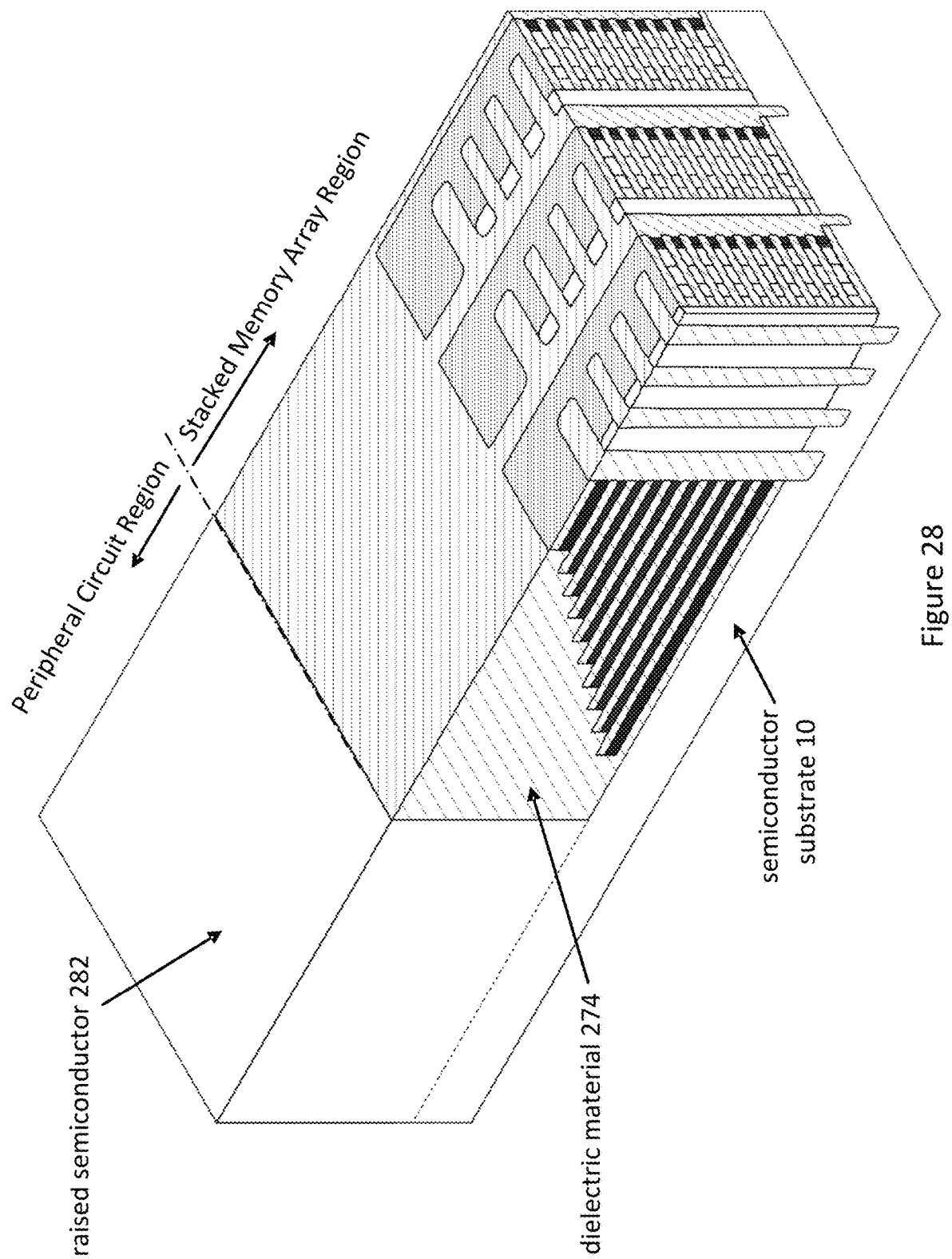

FIG. 28 illustrates another embodiment for provision of peripheral circuitry for the memory array. By providing a thick layer of raised semiconductor material 282, for example, epitaxial silicon, in the peripheral circuit region, that portion becomes coplanar with the upper surface of the memory array. This allows the peripheral circuitry to be fabricated in the bulk-like region before or after the memory array cells are formed. This approach enables the electrical connections to the peripheral circuit, and connections between that circuitry and the memory array, to be made using well-known advanced CMOS logic processes.

Figure 29:
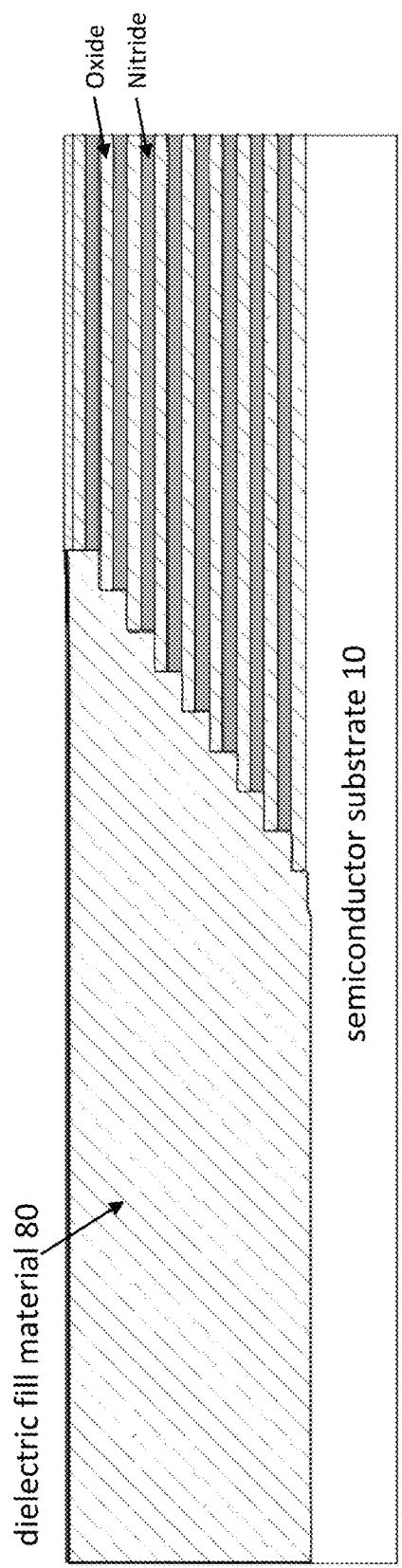

FIGS. 29-33 illustrate a preferred embodiment for fabrication of the peripheral circuitry in which it is formed as an integrated part of the process used to fabricate the memory array. FIG. 29 is a cross section of the memory array region and the peripheral circuit region after dielectric fill material 80 has been deposited and planarized using the steps described above for formation of the memory array. FIG. 8 is a perspective view at this stage of the process.

Figure 30:
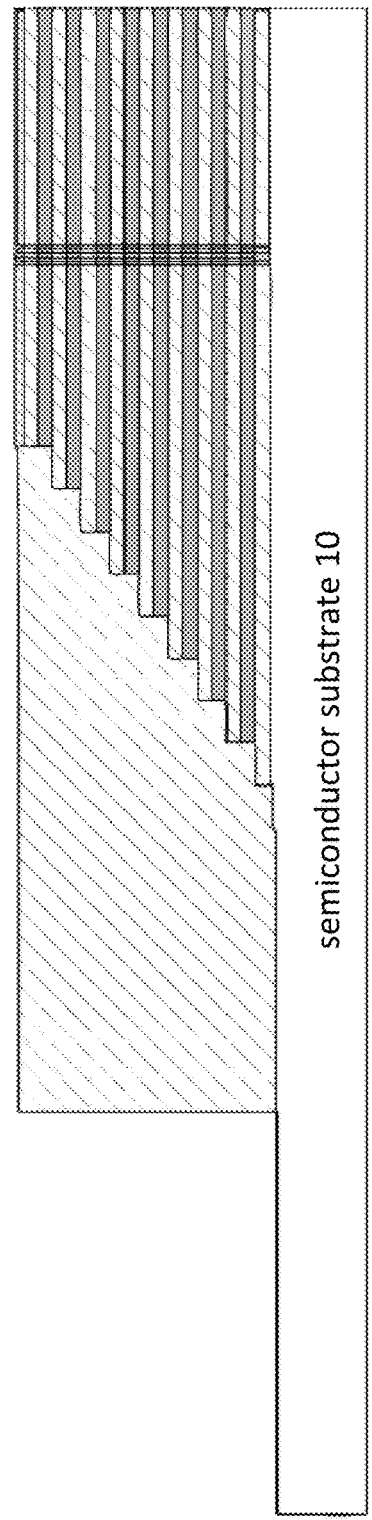

The next stage of the process with regard to the peripheral circuitry is shown in FIG. 30. Using conventional masking and photolithographic techniques, regions of the dielectric fill 80 are removed where the peripheral circuitry is to be formed. In the preferred process, this step is carried out using the same steps in which the SEG slots 90 are cut in the memory array region, as described above in conjunction with FIGS. 6A and 6B. Alternatively, etching of the peripheral circuit region and memory array region can be carried out separately.

Figure 31:
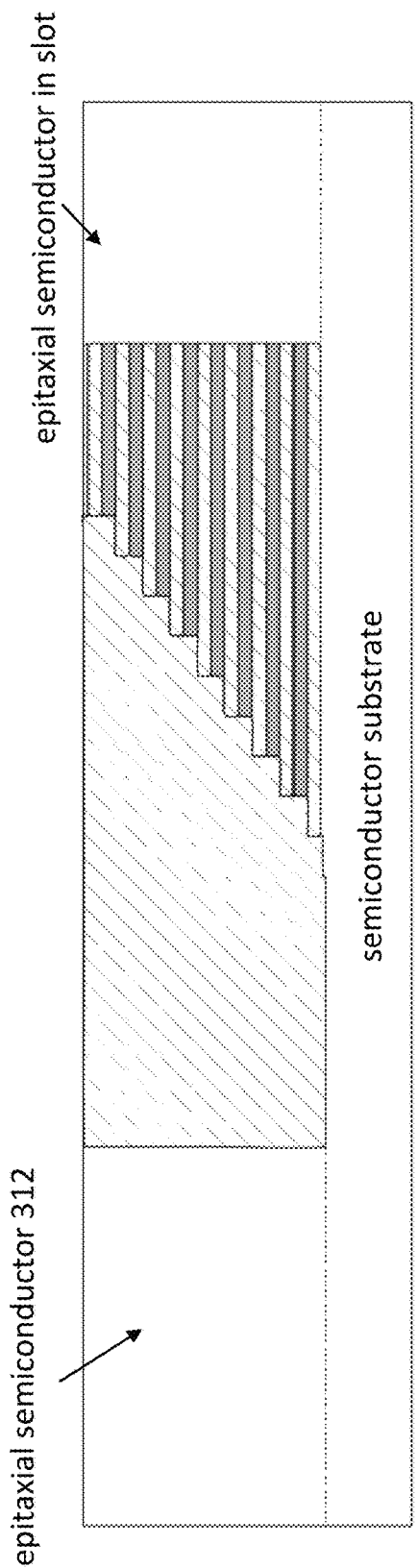

FIG. 31 illustrates the next steps in the process. As shown there, epitaxial semiconductor material 312 (typically silicon) is grown on the semiconductor substrate in the SEG slots and in the region the peripheral circuitry will be formed. This provides single crystal silicon regions for the peripheral circuitry.

Figure 32:
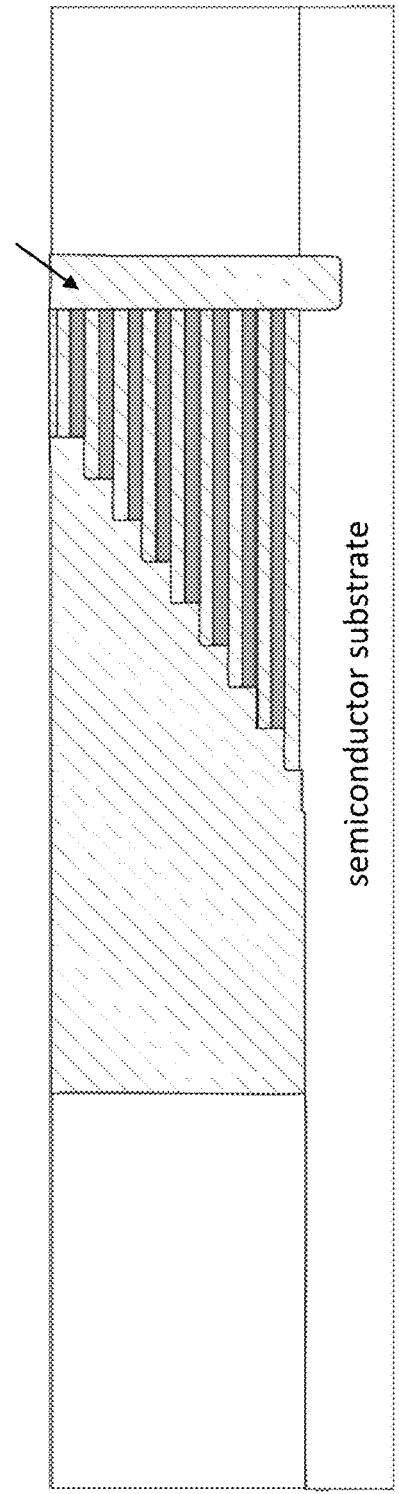

As shown by FIG. 32, desired regions of the structure are next patterned, etched and then filled with silicon dioxide. As described above with regard to FIGS. 9 and 10, the oxide regions grown in the slots provide support for the stacked layers and block the growth of epitaxial silicon.

Figure 33:
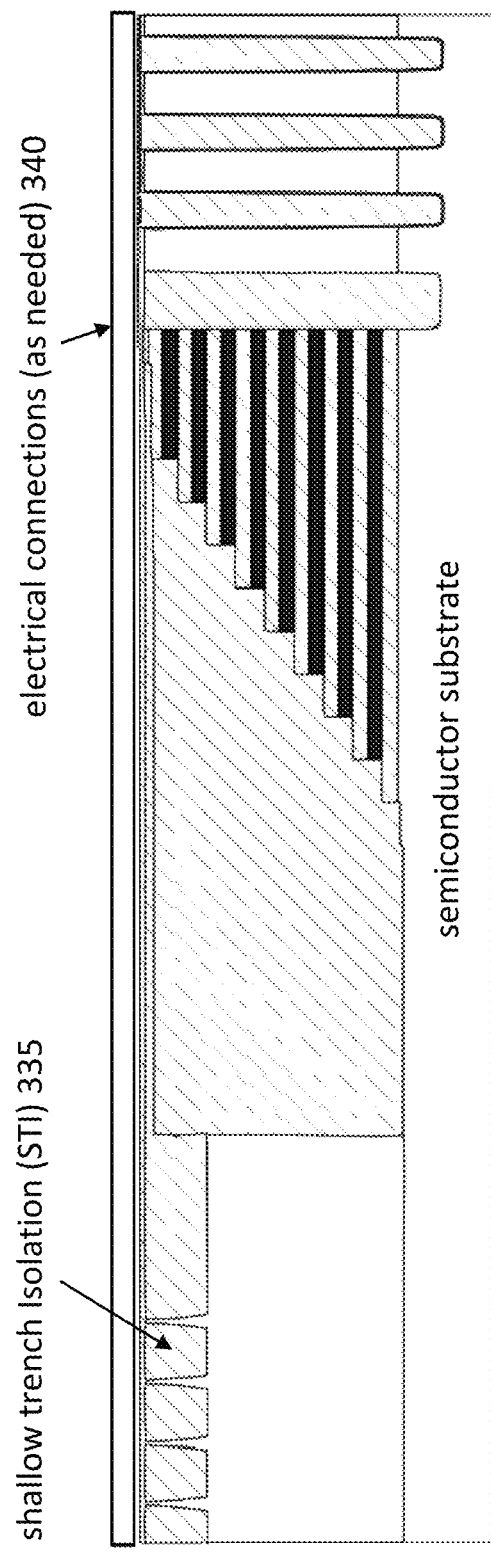

As next shown in FIG. 33, shallow trench isolation regions 335 are formed in the epitaxial silicon of the peripheral circuitry region. Well and threshold voltage (Vt) adjustment implantations are then performed for peripheral CMOS transistors and other active junction devices.

Using processes well known in the art, planar, FinFET or other transistors are formed in the peripheral circuit region, and the remaining steps necessary to form the memory array are performed. (These steps are described in conjunction with FIGS. 11-26.) Once the array is completed, electrical contacts and metallization 340 are then formed across the periphery and cell array regions. In this manner the peripheral circuitry is coplanar and coupled to the various memory array lines shown in FIGS. 3A, 3B, and 3C.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A multi-layer electronic device comprising:
a semiconductor substrate;
z layers of semiconductor devices, each of the z layers including an array of x rows by y columns of semiconductor devices;
a first set of electrical connections connecting strings of semiconductor devices, each string including one semiconductor device from each of the z layers in the array connected together;
an array of x by y first electrical connections connecting a first terminal of each thyristor in each string to the semiconductor devices above it and the semiconductor device below it in that string;
a first set of word line connections extending in parallel to connect rows of the strings together;
a first set of bit line connections extending in parallel on each layer to connect together columns of semiconductor devices on each layer, the first set of bit line connections on each layer extending outward on each layer away from the array further than the second set of electrical connections on the layer immediately above it so as to form a stair-step arrangement of electrical connections; and
peripheral circuitry connected to the first set of electrical connections, the first set of word line connections, and the first set of bit line connections for providing control signals to the first set of electrical connections, the first set of word line connections, and the first set of bit line connections.

2. The multi-layer electronic device of claim 1 wherein the peripheral circuitry being formed in a layer of semiconductor material on the semiconductor substrate and coplanar with upper layers of the z layers of electronic devices.

3. The multi-layer electronic device of claim 1 wherein the peripheral circuitry being formed in a layer of semiconductor material on the semiconductor substrate and coplanar with lower layers of the z layers of electronic devices.

4. A semiconductor fabrication process comprising:
depositing a stack of alternating layers of insulating material and first material on a first portion of a semiconductor substrate;
depositing dielectric material on a second portion of the semiconductor substrate;
etching trenches through the stack of alternating layers, and in the same process, etching away the dielectric material from a peripheral circuit region of the second portion at a level coplanar with predetermined layers of the stack of alternating layers of insulating material and first material on the first portion;
providing epitaxial semiconductor material on the peripheral circuit region and in selected locations over the first portion of the semiconductor substrate;
removing selected regions of the epitaxial semiconductor material from the peripheral circuit region and filling those selected regions with dielectric to thereby define electrically isolated pockets for semiconductor devices; and
forming semiconductor devices in the electrically isolated pockets.

5. The semiconductor fabrication process of claim 4 wherein the step of etching trenches comprises etching away the dielectric material from a peripheral circuit region of the second portion at a level coplanar with upper layers of the stack of alternating layers of insulating material and first material on the first portion.

6. The semiconductor fabrication process of claim 4 wherein the step of etching trenches comprises etching away the dielectric material from a peripheral circuit region of the second portion at a level coplanar with lower layers of the stack of alternating layers of insulating material and first material on the first portion.

* * * * *